US009807878B2

(12) United States Patent
Tatami et al.

(10) Patent No.: US 9,807,878 B2
(45) Date of Patent: Oct. 31, 2017

(54) GRAPHITE SHEET, METHOD FOR PRODUCING SAME, LAMINATED BOARD FOR WIRING, GRAPHITE WIRING MATERIAL, AND PROCESS FOR PRODUCING WIRING BOARD

(71) Applicant: KANEKA CORPORATION, Osaki-shi, Osaka (JP)

(72) Inventors: Atsushi Tatami, Settsu (JP); Mutsuaki Murakami, Settsu (JP); Masamitsu Tachibana, Settsu (JP)

(73) Assignee: KANEKA CORPORATION, Osaka-Shi (JP)

( * ) Notice: Subject to any disclaimer, the term of this patent is extended or adjusted under 35 U.S.C. 154(b) by 0 days.

(21) Appl. No.: 15/025,075

(22) PCT Filed: Aug. 7, 2014

(86) PCT No.: PCT/JP2014/070932
§ 371 (c)(1),
(2) Date: Mar. 25, 2016

(87) PCT Pub. No.: WO2015/045641
PCT Pub. Date: Apr. 2, 2015

(65) Prior Publication Data
US 2016/0249453 A1 Aug. 25, 2016

(30) Foreign Application Priority Data

Sep. 26, 2013 (JP) .................................. 2013-199329
Feb. 18, 2014 (JP) .................................. 2014-028648
Mar. 12, 2014 (JP) .................................. 2014-049427

(51) Int. Cl.
*H05K 1/09* (2006.01)
*H05K 1/02* (2006.01)
*C01B 31/04* (2006.01)
*H05K 3/02* (2006.01)
*H05K 3/46* (2006.01)
*B32B 9/04* (2006.01)
*H05K 1/03* (2006.01)
*B32B 9/00* (2006.01)
*B32B 27/20* (2006.01)
*B32B 27/28* (2006.01)
*B32B 27/34* (2006.01)

(52) U.S. Cl.
CPC ............... *H05K 1/09* (2013.01); *B32B 9/007* (2013.01); *B32B 9/045* (2013.01); *B32B 27/20* (2013.01); *B32B 27/281* (2013.01); *B32B 27/34* (2013.01); *C01B 31/04* (2013.01); *H05K 1/0296* (2013.01); *H05K 1/0306* (2013.01); *H05K 1/0353* (2013.01); *H05K 3/027* (2013.01); *H05K 3/4611* (2013.01); B32B 2307/202 (2013.01); B32B 2307/206 (2013.01); B32B 2307/302 (2013.01); *B32B 2457/00* (2013.01); *C01B 2204/04* (2013.01); *C01B 2204/24* (2013.01); *C01B 2204/32* (2013.01)

(58) Field of Classification Search
CPC ......... B32B 9/007; B32B 27/20; B32B 27/34; B32B 9/045; B32B 27/281; H05K 1/0353; H05K 1/0306; H05K 1/0296; H05K 3/4611; H05K 3/027; H05K 1/09; C01B 2204/04; C01B 31/04
USPC ........................................................ 423/448
See application file for complete search history.

(56) References Cited

U.S. PATENT DOCUMENTS

| | | | |
|---|---|---|---|
| 2007/0032589 A1 | 2/2007 | Nishikawa et al. | |
| 2007/0278212 A1 | 12/2007 | Okimura | |
| 2009/0301697 A1 | 12/2009 | Hirose | |
| 2010/0266830 A1 | 10/2010 | Nishikawa et al. | |
| 2011/1691180 * | 7/2011 | Inada et al. ............. | C01B 31/02 423/448 |
| 2012/0034151 A1 | 2/2012 | Nishikawa et al. | |
| 2013/0101498 A1 | 4/2013 | Nishikawa et al. | |
| 2014/0056801 A1 | 2/2014 | Nishikawa et al. | |

FOREIGN PATENT DOCUMENTS

| | | | |
|---|---|---|---|
| CN | 102730675 A | 10/2012 | |
| JP | 1-260709 A | 10/1989 | |
| JP | 3-203285 A | 9/1991 | |
| JP | 5-43213 A | 2/1993 | |
| JP | 11-224976 A | 8/1999 | |
| JP | 2003-279954 A | 10/2003 | |
| JP | 2008-272976 A | 11/2008 | |
| JP | 4299261 B2 | 7/2009 | |

(Continued)

OTHER PUBLICATIONS

Hishiyama et al., "Crystal-grain size, phonon and carrier mean free paths in the basal plane, and carrier density of graphite films prepared from aromatic polymide films", Tanso, 2012, No. 254, pp. 176-186.

(Continued)

*Primary Examiner* — Daniel C McCracken
(74) *Attorney, Agent, or Firm* — Birch, Stewart, Kolasch & Birch, LLP

(57) ABSTRACT

The first present invention is a graphite sheet having a thickness of not more than 9.6 μm and more than 50 nm and a thermal conductivity along the a-b plane direction at 25° C. of 1950 W/mK or more. The second present invention is a graphite sheet having a thickness in a range of less than 9.6 μm and 20 nm or more, an area of 9 mm2 or more, and a carrier mobility along the a-b plane direction at 25° C. of 8000 cm2/V·sec or more.

15 Claims, 3 Drawing Sheets

(56) References Cited

FOREIGN PATENT DOCUMENTS

| JP | 2010-120818 A | 6/2010 |
|---|---|---|
| JP | 4512802 B2 | 7/2010 |
| JP | 2010-234556 A | 10/2010 |
| JP | 4684354 B2 | 5/2011 |
| JP | 2012-60010 A | 3/2012 |
| JP | 2012-74682 A | 4/2012 |
| JP | 2008-28352 A | 10/2012 |
| JP | 2013-187415 A | 9/2013 |
| JP | 2013-212938 A | 10/2013 |
| KR | 10-0828109 B1 | 5/2008 |

OTHER PUBLICATIONS

International Search Report, issued in PCT/JP2014/070932, dated Nov. 4, 2014.
Kelly et al., "The Basal Thermal Conductivity of Highly Oriented Pyrolytic Graphite as a Function of Degree of Graphitisation", Carbon, 1969, vol. 7, pp. 355-358.
Klemens et al., "Thermal Conductivity of Graphite in the Basal Plane", Carbon, 1994, vol. 32, No. 4, pp. 735-741.
Lloyd et al., "Electromigration in copper conductors", Elsevier, Thin Solid Films, 1995, vol. 262, pp. 135-141
Murakami et al., "High-Quality and Highly Oriented Graphite Block from Polycondensation Polymer Films", Carbon, 1992, vol. 30, No. 2, pp. 225-262, 2. Experimental, 3. Results and Discussion, Figures, Tables.
Novoselov et al., "Electric Field Effect in Atomically Thin Carbon Films", Science, Oct. 22, 2004, vol. 306, pp. 666-669.
Wei et al., "Reliability and current carrying capacity of carbon nanotubes", Applied Physics Letters, Aug. 20, 2001, vol. 79, No. 8, pp. 1172-1174.
Written Opinion of the International Searching Authority, issue in PCT/JP2014/070932, dated Nov. 4, 2014.
Nagata et al., "Change of Ordered Structure by Carbonizing of Aromatic Polyimide Films," Sen'I Gakkaishi Coden: SENGA5, vol. 53, No. 7, 1997, pp. 281-288.
Takeichi et al., "Carbonization and Graphitization of Polyimide Films: Polyamide Acid Methyl Ester of PMDA/PDA as a Precursor," Journal of Applied Polymer Science, vol. 61, Jun. 6, 1998, pp. 1571-1578.

* cited by examiner

[Fig. A-1]
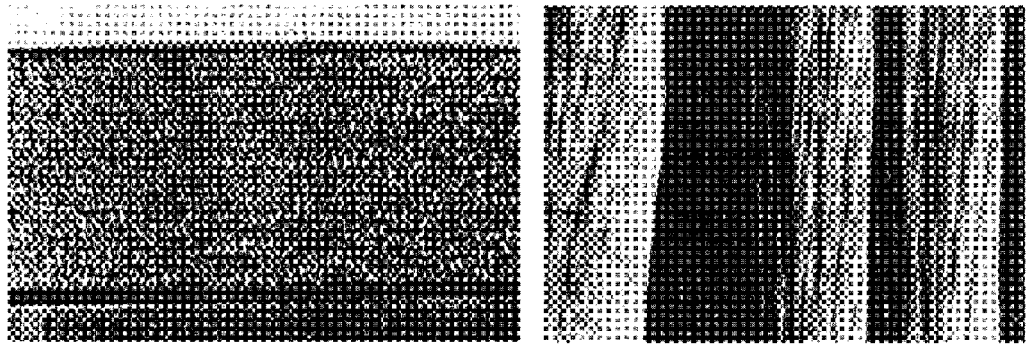
(a)          (b)
[Fig. A-2]
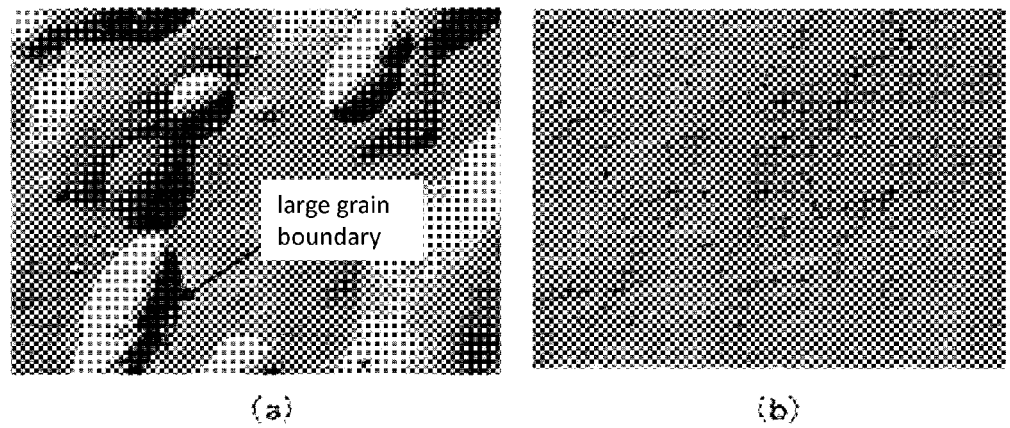
(a)          (b)
[Fig. A-3]
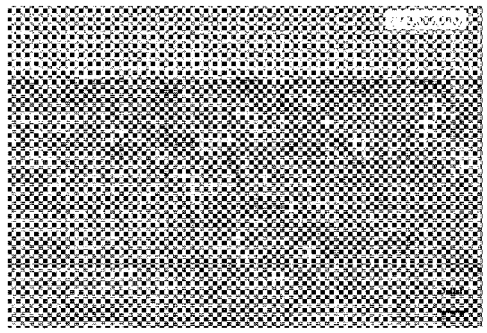

[Fig. B-1]
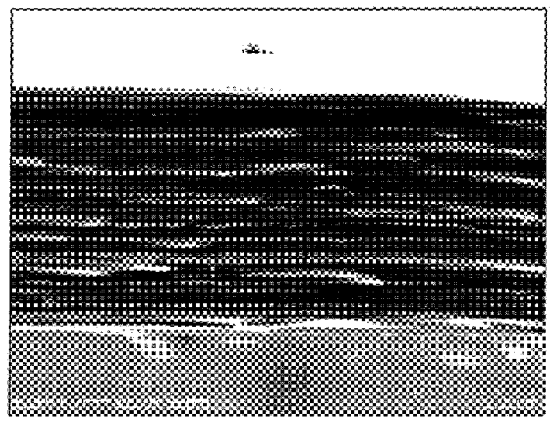
[Fig. B-2]
[Fig. B-3]
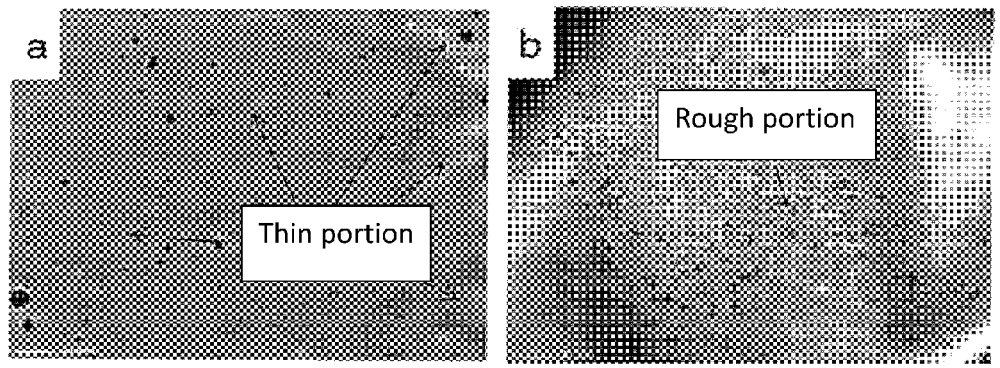

[Fig. B-4]
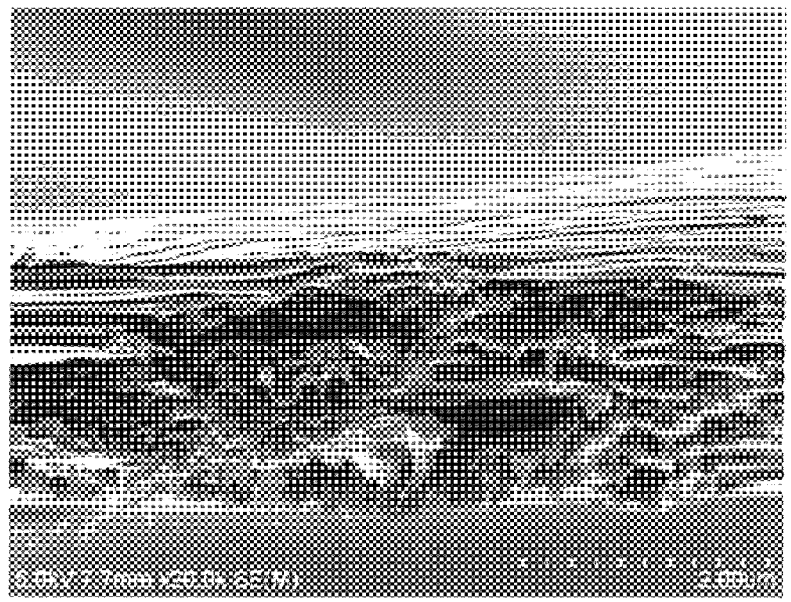
[Fig. B-5]
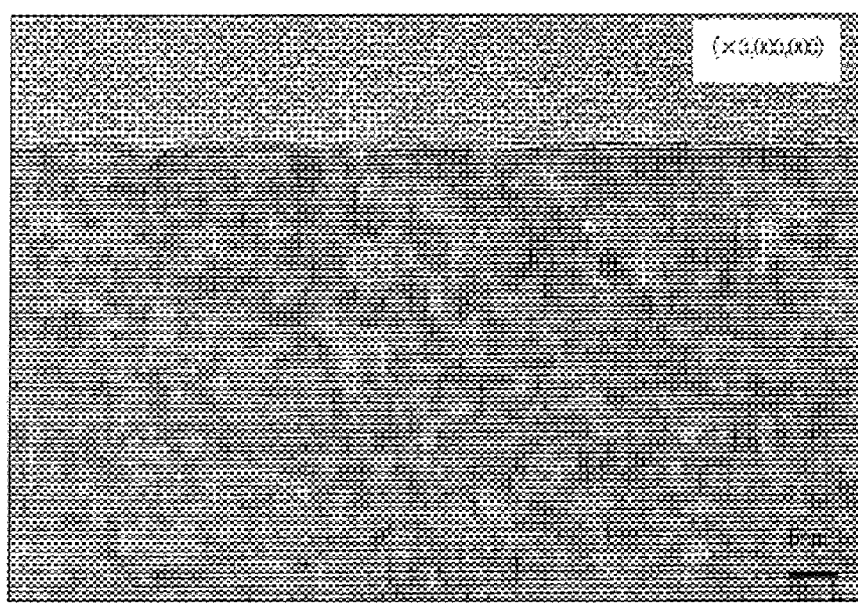

GRAPHITE SHEET, METHOD FOR PRODUCING SAME, LAMINATED BOARD FOR WIRING, GRAPHITE WIRING MATERIAL, AND PROCESS FOR PRODUCING WIRING BOARD

TECHNICAL FIELD

The present invention comprises a first aspect and a second aspect, and the first aspect and the second aspect will be described in this order.

(First Aspect)

The present invention (first aspect) relates to a graphite sheet having a larger thermal conductivity than a limit value of thermal conductivity along the a-b plane of heretofore known graphite, and a method for producing the same.

(Second Aspect)

The present invention (second aspect) relates to a new graphite sheet having a characteristic of high carrier mobility and favorably has a characteristic of current density resistance exceeding conventional copper wiring, a method for producing the same, a laminated board for wiring, a graphite wiring material, and a process for producing a wiring board.

BACKGROUND ART

Background Art Related to First Aspect

In recent years, defects of mobile terminals due to heat generation become obvious with installation of a high performance chip set. Personal computers can be cooled by a CPU cooler or the like; however, in smartphones or tablets, there is not a cooling method other than natural heat dissipation utilizing a housing since there are many restrictions such as thinning of a housing, weight saving of a device or the like. In the case of such advanced communication devices, the device is often effectively operative only within a predetermined threshold temperature range. Concerning some of the smartphones, problems that communication is disconnected or a main body is not normally operative by heat generation due to a long period of use are reported. In order to further improve performance, methods such as laminating a microprocessor and a memory or laminating semiconductor chips on one another are investigated, but there is a possibility that memory malfunctions by a large quantity of heat accumulated in a chip. Further, when an operation temperature becomes 175° C. to 200° C., since this temperature is close to a melting point of a solder material, there may be cases where a conventional solder material cannot be used. In order to prevent such failures or accidents due to heat, how a large quantity of heat accumulated in a housing or a chip is dissipated is an urgent issue (Non-Patent Document 1).

For a heat dissipation treatment of such a heating element, there is a method of diffusing or dissipating heat of the heating element quickly by bringing a material excellent in thermal conductivity such as a heat spreader or a heat dissipation fin into contact with the heating element. It is needless to say that the higher the thermal conductivity of a material used for this purpose is, the more it is preferred, and a highly thermal conductive metal is often used. However, the thermal conductivities of aluminum and copper are 220 W/mK and 400 W/mK, respectively, and cannot be said to be so high. Moreover, there is a defect that the housing becomes heavy by use of a metal.

Besides the above-mentioned metal heat dissipation materials, a heat dissipation treatment using a graphite sheet is known. One of the graphite sheets used for such a purpose is a sheet using natural graphite (Patent Document 1). However, the thermal conductivity in a plane direction of the natural graphite sheet is about 200 to 500 W/mK, and while it has a characteristic of being light, sheet strength is low because a powdery or scale-like natural graphite is used as a raw material, and there is a possibility that graphite pieces are scattered in a housing when the graphite sheet is broken.

In order to solve such problems, a method of graphitizing a special polymer sheet by directly heat-treating the sheet is developed (hereinafter, referred to as a polymer baking method). This graphite sheet preparation method is characterized by being simpler than a conventional preparation method of a natural graphite sheet, giving the sheet excellent mechanical characteristics, and further giving the sheet very high thermal conductivity (Patent Document 2). Since the thermal conductivity in a plane direction of the graphite sheet prepared by the polymer baking method is as high as 600 to 1600 W/mK and the graphite sheet has resistance to bending or impact, the graphite sheet is currently employed in many mobile terminals. However, a graphite sheet having higher thermal conductivity is desired in order to respond to characteristics required in association with the improvement in performance of mobile terminals described above.

A basic structure of a graphite crystal is a layered structure in which base planes formed by carbon atoms bound in the form of a hexagonal network are orderly stacked (a direction in which layers are stacked is referred to as a c-axis, and a direction in which the base plane formed by carbon atoms bound in the form of a hexagonal network extends is referred to as an a-b plane direction). Carbon atoms within the base plane are strongly bound with a covalent bond, and on the other hand, binding between faces of layers stacked depends on a weak Van der Walls force, and an interlayer distance is 0.3354 nm in an ideal structure. The electrical conductivity or the thermal conductivity in graphite is large in the a-b plane direction reflecting such anisotropy, and therefore the electrical conductivity and the thermal conductivity in this direction are good measures for determining graphite quality. It is known that the thermal conductivity along the a-b plane direction in the heretofore known graphite of the highest quality such as vapor phase-grown graphite (HOPG (highly oriented pyrolytic graphite)) or natural single crystal graphite is 1900 to 1950 W/mK. In this case, the thermal conductivity along the c-axis direction is 5 W/mK, and 300 to 400 times smaller than that along the a-b plane direction (Non-Patent Documents 1 and 2). The thermal conductivity along the a-b plane direction of the graphite is the largest value next to a thermal conductivity of diamond (2000 W/mK).

Thermal properties of graphite are principally based on vibration (phonon) of a crystal lattice. That is, high heat conduction along the a-b plane direction of the graphite comes from the phonon derived from a strong bond between carbon atoms forming a plane, and the characteristics of thermal conductivity depends on crystal integrity and a size of a crystallite. A theoretical limit value of such thermal conductivity along the a-b plane direction of graphite has been reported to be 1910 W/mK. (Non-Patent Documents 2 and 3), and as an experimental value, as described above, 1950 W/mK of the HOPG has been known as the maximum value of the thermal conductivity (Non-Patent Document 4). As described in these reports, since it has been thought that the theoretical value agrees well with the experimental value, it is presently believed that this value is a limit value of thermal conduction of graphite. That is, according to the common wisdom, a limit value of the thermal conductivity along the a-b plane direction of graphite is 1950 W/mK, and it has not been expected at all that in some cases, it is possible to exceed this value and the value of the thermal conductivity along the a-b plane direction of graphite can be compatible with or exceed a value of diamond.

Background Art Related to Second Aspect

Copper as an electric wiring material has been used over the years as a fundamental material supporting current industries. The reason for this is that copper is a metal having the highest electrical conductivity (specific resistance: $1.72 \times 10^{-6}$ Ωcm) next to silver, is much lower in cost than silver, is excellent in heat resistance, durability and flexibility, is easy to form into a linear shape or a film-like shape, and is easily processed (circuit formation) by etching. However, in association with recent technical progress, severe request for passing a larger current through a wiring circuit is increasing, and problems thereof have become obvious. The severe request is becoming a deep problem particularly in uses of a fine copper wiring circuit such as in a semiconductor element, a power electronics circuit through which a large current is passed, and so on.

This matter can be specifically described as the characteristic of current density resistance (magnitude of a current capable of being passed per unit area) of copper. The characteristic of current density resistance of a copper wiring material is said to be $10^3$ to $10^7$ A/cm2. The reason why the characteristic of current density resistance of a copper wiring material largely varies like this is that the characteristic of current density resistance changes significantly depending on measurement conditions or the definition of the characteristic of current density resistance. For example, there is an example in which a criterion of the characteristic of current density resistance is defined as "temperature is increased to 60° C. or more," and an example in which a criterion of the characteristic of current density resistance is defined as "a circuit is cut (broken) by melting." Naturally, in the case of the former, the characteristic of current density resistance becomes a small value, and the characteristic of current density resistance becomes a large value according to the criterion of the latter. Moreover, even when the criterion (definition) of the characteristic of current density resistance is determined as "a current value at which a circuit is lead to break by melting or the like," the characteristic of current density resistance of a copper wiring material is said to be $10^6$ to $10^7$ A/cm2, and the value significantly changes even with the criterion (definition) defined. This is because the characteristic of current density resistance also changes depending on factors such as a thickness (cross-section area) of the copper wiring material and a formation method of copper wiring (Non-Patent Document 6).

In general, the characteristic of current density resistance is deteriorated in a thinner copper wire, and this is thought to be due to the fact that the effect of scattering of electrons at a crystal grain boundary existing in the copper wire (grain boundary effect) and the effect of reflection of electrons at side walls (side wall effect) are increased. Moreover, since a resistance value increases with an increase in temperature in a copper wire (so-called metallic temperature characteristic), there are problems that Joule heat generated by passing an electric current causes a resistance value of the copper wire to increase, and this further accelerates a temperature rise, resulting in melt break. Such a problem becomes obvious when a line width is 2 mm or less in a wiring circuit such as LSI, and becomes remarkable when the line width is 100 nm or less.

The second problem of the copper wiring material is its large specific gravity. The specific gravity of copper is 8.65, and request for reducing a weight of the copper wiring is a long-held dream of a so-called heavy electric field such as electric magnets and motors.

From the reason described above, carbon materials as a wiring material other than copper wiring have been used for a long time as an electric conducting material. For example, a circuit prepared by printing a composite material of a carbon powder such as carbon black or graphite and a polymer on an insulating substrate is put to practical use. Although a wiring circuit provided with such a carbon-printed resistive element is widely used because of ease of formation and low price (Patent Documents 3 and 4), circuits prepared by this method are used in applications such as a heater, has a resistance value higher than that of copper wiring, and is far below the copper wiring in the characteristic of current density resistance, and therefore it cannot be said that carbon materials are an alternative wiring material to copper wiring.

Contrasted with a wiring material of such a carbon-polymer composite type, some really alternative materials to the copper wiring are considered, and one candidate of the materials is graphite. A common reason why the graphite is expected to be an alternative material to a copper wiring material is following four points. The first reason is that since a heat-resistant temperature (decomposition and sublimation temperature) of graphite is 3000° C. and higher than a melting point (1084° C.) of copper, the characteristic of current density resistance is thought to be able to increase. The second reason is that graphite is light. The theoretical specific gravity of graphite is 2.26, and it is about ⅓.8 of the specific gravity (8.65) of copper. This suggests a possibility that a problem of a weight of a copper wiring material can be overcome. The third reason is that in the case of graphite of high quality, since its thermal conductivity (a-b plane direction of graphite: 1900 W/mK) is larger than the thermal conductivity of copper (Cu: 400 W/mK), it is thought that heat dissipation efficiency can be increased, and this indicates a possibility of resisting application of a large current. The fourth reason is that resistance of the a-b plane of graphite is little increased even when heat generation due to application of a current occurs, and therefore it is thought that break of wiring due to self-heating can be avoided contrasted with copper wiring.

However, the present inventors thought that the graphite may offer a large advantage other than the above-mentioned reasons. The advantage is that if graphite of extremely high quality can be prepared, the effect of scattering of electrons at a crystal grain boundary and the effect of reflection of electrons at side walls due to application of a large current could be suppressed.

That is, the electrical conductivity of a substance is represented by the product of the number of electrons existing in the substance (carrier concentration) and the mobility of the electron (carrier mobility). The reason why the electrical conductivity of copper is high results from a high carrier concentration thereof ($8.9 \times 10^{22}$ cm−3), but a value of the carrier mobility of copper is 16 cm2/V·sec and not so large. On the other hand, the carrier concentration of the graphite single crystal is about $1 \times 10^{19}$ cm−3 and the carrier mobility in the basal plane direction is 12500 to 14000 cm2/V·sec, and the carrier concentration is 10000 to 100000 times smaller than that of copper and the carrier mobility is 780 to 875 times larger than that of copper (Non-Patent Document 7).

As a result of this, the electrical conductivity in the basal plane direction of graphite is nearly 20 times smaller than that of copper. The graphite is inferior to copper from the viewpoint of the electrical conductivity like this, but it is thought that the graphite is very effective at suppressing the grain boundary effect and the side wall effect which become problems particularly in fine copper wiring because of less number of carriers even when a current is applied. This shows a large prospect of a high quality graphite wiring material in the fine wiring. Therefore, the present inventors thought that if ideal graphite can be prepared, the current density resistance thereof can be made larger than that of copper by utilizing the characteristic of high carrier mobility of the graphite. That is, a point of development of a graphite material that can be alternative to copper is to develop a graphite material having high carrier mobility.

As a specific trial to use graphite as a wiring material, is reported an example of graphite wiring prepared by locally heating a diamond film formed by a vapor-phase epitaxial growth method with energy beams (Patent Document 5), or an example of a method for forming a wiring pattern composed of a graphite film having a graphene structure by suppressing agglomeration of a catalyst layer and adjusting a diffusion rate of carbon (Patent Document 6). Also is reported a heat-resistant wiring board characterized in that wiring composed of any one of graphite and a graphite interlayer compound having heat resistance is formed on the surface of a substrate having heat resistance (Patent Document 7). This wiring board is one in which wiring composed of a graphite thin film prepared by a CVD method is formed on a silicon substrate, and further, NiCl having a high melting point is intercalated. The wiring board exhibits high heat resistance by employing such a constitution. However, all of these methods are extremely special technique and do not have a track record of practical realization, and are far from a common technique giving alternative characteristics to copper wiring.

That is, the characteristic of carrier mobility of the above graphite is absolutely a characteristic in an ideal graphite crystal, and it is extremely difficult to realize such a characteristic in large area film-like or linear test pieces capable of being used as a wiring material, and such a graphite material has not been realized. For example, the values of the above carrier mobility 12500 to 14000 cm2/V·sec are characteristics in extremely fine crystal pieces peeled off from a natural fine graphite crystal of high quality and a highly oriented graphite crystal (HOPG (highly ordered pyrolytic graphite)) artificially prepared at a high temperature of 3300° C.

Moreover, in order to use graphite as an industrial wiring material, it is necessary that the graphite has its characteristic uniformly in a large area in addition to being of high quality. In general, in the large area test piece, since cracks, crystal irregularities, and impurities are more likely to exist within the test piece, and these cause the carrier mobility to decrease, it is thought to be extremely difficult to prepare a material with a large area having high carrier mobility. That is, for example, a graphite film with an area of 3×3 mm2 or more, a characteristic of a carrier mobility of 8000 cm2/V·sec or more, and a characteristic exceeding the characteristic of current density resistance of copper cannot be prepared by conventional techniques.

On the other hand, in recent years, as a material having an ideal graphite structure, nanographite materials such as carbon nanotubes (CNT) and graphene receive attention because of their excellent electric/thermal properties. For example, with respect to a monolayer graphene, it is reported that the carrier mobility is 15000 to 40000 cm2/V·sec (Non-Patent Documents 8 and 9) and that the maximum current density resistance is 107 to 108 A/cm2 (Non-Patent Document 10). Therefore, research and development for using the monolayer graphene in wiring of LSI, for example, by making use of excellent characteristics of graphene itself is made (Patent Document 8). However, in spite of such efforts, a technique of actually forming a practical wiring circuit from such nanographite materials has not been realized.

The reason why a wiring circuit formation technique using nanographite such as CNT and graphene is not established results from the same technical problems that its test piece size is notably small and a practically-sized test piece cannot be prepared as those previously described in the graphite crystal. That is, the characteristic of current density resistance of the monolayer graphene is a value measured in an extremely fine test piece on the order of micron, which is a graphite layer peeled off from the HOPG. Such a situation is the same in the CNT, and an excellent characteristic of current density resistance of CNT was measured in one extremely fine fibrous test piece (Non-Patent Document 11), and it is extremely difficult to form an electronic circuit using CNT. Although nanocarbon itself is a material having very excellent properties, it is an extremely small test piece, and it is extremely difficult to employ it as an alternative wiring material to copper.

On the other hand, as a method of achieving a large area graphite sheet, a method of graphitizing a special polymer sheet by heat-treating the sheet is developed (hereinafter, referred to as a polymer baking method). The graphite sheet obtained by this polymer baking method is characterized in that the sheet is high in quality and excellent in mechanical characteristics, and has an excellent characteristic of thermal conductivity, compared with a heretofore known sheet prepared by a sheet preparation method of using natural graphite (referred to as an expanding method). Therefore, the graphite film prepared by the polymer baking method is widely used for a heat dissipation use and a thermal diffusion use.

Various techniques such as an invention regarding a graphite film-polymer composite film for imparting insulation properties to the graphite film (Patent Documents 9 to 12), and a laminate without an adhesive layer, formed by directly bonding a graphite film to a polyimide aimed at dissipating heat (Patent Document 13) are reported for actually using a graphite film for a heat dissipation use. However, all of objects of these inventions are to use graphite as a heat dissipation use, and for example, in Patent Documents 9 to 11, since a thickness of the graphite sheet is set to 10 μm or more, the carrier mobility and the current density resistance are thought to be low. Further, Patent Documents 12 and 13 do not teach the thickness, the carrier mobility and the current density resistance of the graphite sheet.

The graphite sheet prepared by the polymer baking method commonly has a thickness in a range of 20 to 40 μm (10 to 75 μm in a special case), an electrical conductivity of about 5000 to 13000 S/cm, and a thermal conductivity of about 1000 to 1600 W/mK (from a catalog of graphite films manufactured by KANEKA CORPORATION, "Graphinity"). Further, the present inventors measured the carrier mobility of a test piece having a thickness of 40 μm by a method described later, and consequently its carrier mobility was 5000 cm2/V·sec. As described above, the graphite film prepared by the polymer baking method has relatively excellent electrical conductivity and thermal conductivity, but these values were inferior to those of a graphite crystal of the highest quality or graphene described above. Therefore, a conventional graphite film prepared by the polymer baking method is not considered as an alternative to a copper wiring material, and investigations thereof were not made.

Moreover, when a heat treatment was carried out at 3000° C. for 90 minutes under a pressure of 0.2 MPa using a polyimide film (a trade name UPILEX 7.5SN, prepared by a thermal cure method, film thickness 7.5 μm) described in Patent Document 13 and the film's thermal conductivity, electrical conductivity and carrier mobility were measured, a thickness of the resulting graphite film was 3 μm, but the thermal conductivity along the a-b plane direction was 996 W/mK, the electrical conductivity was 15000 S/cm, and the carrier mobility was 4000 cm2/V·sec, and characteristics of the film were inferior to those of the present invention (second aspect). A photograph of a cross-section of the graphite film obtained at this time is shown in FIG. B-1. In FIG. B-1, it is found that striped pattern is cut off at various locations compared with a neatly oriented striped pattern which is seen in a graphite film of the present invention (second aspect) described later and the orientation is not ordered. Since the used raw material polyimide is prepared by a thermosetting method, the carrier mobility and the current density resistance are thought to be low. From the above, although a laminate circuit in which a copper plating layer is formed on an outer surface of a graphite sheet is described in Patent Document 13, a role of the graphite sheet in this case is all just heat dissipation, and it is evident that the graphite sheet cannot be used as a wiring material comparable to the present invention (second aspect).

Although Patent Document 14 discloses a technique of heat-treating a polyimide film to form a graphite film, this graphite sheet is used as a heat dissipation sheet as with Patent Documents 9 to 13 and does not teach either of the carrier mobility and the current density resistance. As described above, it is not realized to use the graphite film itself as a wiring material.

PRIOR ART

Patent Document

Patent Document 1: JP4299261B (first aspect)
Patent Document 2: JP4684354B (first aspect)
Patent Document 3: JPH11-224976A (second aspect)
Patent Document 4: JPS61-22684A (second aspect)
Patent Document 5: JPH03-203285A (second aspect)
Patent Document 6: JP2012-74682A (second aspect)
Patent Document 7: JPH1-260709 A (second aspect)
Patent Document 8: JP2012-60010A (second aspect)
Patent Document 9: JP2010-120818A (second aspect)
Patent Document 10: JP2008-272976 A (second aspect)
Patent Document 11: JP2008-28352 A (second aspect)
Patent Document 12: JP2003-279954 A (second aspect)
Patent Document 13: JP2010-234556 A (second aspect)
Patent Document 14: JP4512802B (second aspect)

Non-Patent Document

Non-Patent Document 1: Nikkei Electronics, Apr. 16, 2012 (first aspect)
Non-Patent Document 2: P. G. Klemens and D. F. Pedraza Carbon 32, 735(1994) (first aspect)
Non-Patent Document 3: P. G. Klemens J. W. Bandgap, Materials, 7(4), 332(2000) (first aspect)
Non-Patent Document 4: Y. Hishiyama, A. Yoshida, Y. Kaburagi Carbon 254, 176(2012) (first aspect)
Non-Patent Document 5: B. T. Kelly, K. E. Gilchrist Carbon 7, 355(1969) (first aspect)
Non-Patent Document 6: J. R. Lloyd and J. J. Clement, Thin Solid Films, 262, 135(1995)(second aspect)
Non-Patent Document 7: I. L. Spain, in: P. L. Warker Jr., P. A. Thrower (Eds). Chemistry and Physics of Carbon, vol, 8, Marcel Dekker, Inc., New York, 1973, pp. 1-150. second aspect)
Non-Patent Document 8: J-H. Chen, et al., Nature Nanotech., 3, 206(2008)(second aspect)
Non-Patent Document 9: K. S. Novoselov, et al., Nature, 423, 197(2005)(second aspect)
Non-Patent Document 10: Novoselov, et al., Science, 306, 666(2004)(second aspect)
Non-Patent Document 11: B. Q. Wei, et al., Appl. Phys. Lett., 79, 1172(2001)(second aspect)
Non-Patent Document 12: (fourth edition) Experimental Chemistry 9, electricity and magnetism (The Chemical Society of Japan ed., Published by Maruzen Co., Ltd. (Jun. 5, 1991 issue)) (second aspect)
Non-Patent Document 13: Matsumoto Rika, Carbon, No. 209, 2003, pp. 174-178 (second aspect)
Non-Patent Document 14: M. Murakami, et al., Carbon, 30, 255(1992)(second aspect)

SUMMARY OF THE INVENTION

Problems to be Solved by the Invention

Problem of First Aspect

It is an object of the present invention (first aspect) to prepare a highly thermal conductive graphite sheet having a thermal conductivity along a film plane direction of 1950 W/mK or more.

Problem of Second Aspect

In view of the above background art related to a second aspect, the present inventors have tried to upgrade quality of a heretofore known graphite sheet by a polymer baking method to the limit, and tried to develop an alternative graphite wiring material to copper wiring. That is, the present invention (second aspect) relates to a new graphite sheet of ultrahigh quality having a large area which has a characteristic of high carrier mobility and favorably has a characteristic of current density resistance higher than that of conventional copper wiring, a method for producing the same, a laminated board for wiring, a graphite wiring material, and a method for producing a wiring board.

As described above, it is an object of the present invention (second aspect) to prepare a graphite sheet having an excellent characteristic of carrier mobility and favorably having a characteristic of current density resistance larger than that of copper, and thereby to realize an alternative graphite wiring material to copper. Further, it is also an object of the present invention (second aspect) to provide a technique of preparing a laminated board for wiring and a wiring board with use of such a graphite sheet or graphite wiring material.

Solutions to the Problems

Solutions to the Problem of First Aspect

In the context described above, in the first aspect, the present inventors challenged to develop extreme thermal conductivity of graphite, and made investigations of graphitization of a polymer ultrathin film. As a result of this, the present inventors succeeded in preparing a highly thermal conductive graphite sheet having a thermal conductivity exceeding a thermal conductivity (1950 W/mK), heretofore thought to be a limit value of the graphite, by using a polymer film having such a thickness that a graphite sheet finally obtained has a thickness in a range of 9.6 μm or less and more than 50 nm, and heat-treating the polymer film at a ultrahigh temperature of 3000° C. or higher, and this has led to completion of the present invention (first aspect). This graphite sheet's thermal conductivity of 1950 W/mK or more is the highest thermal conductivity as a large area film (sheet) which can be easily practically handled, excluding an example in which the diamond film, monolayer graphene or nanocarbon such as a carbon nanotube is measured by a special method (temperature changing method of Laser Raman spectrum). Accordingly, its application range is believed to be very wide.

In addition, in the first aspect of the present specification, the terms "film" and "sheet" do not limit a thickness thereof, and both terms are used in a sense of a film-like material, and distinguished from a "plate" lacking flexibility in that the film and the sheet have the flexibility in a thickness direction.

That is, the present invention (first aspect) is (1) a graphite sheet having a thickness of 9.6 μm or less and more than 50 nm and a thermal conductivity along the film plane direction at 25° C. of 1950 W/mK or more (preferably 2080 W/mK or more. The same applies hereinafter), and a production process thereof.

The present invention (first aspect) is the graphite sheet according to (1), having a thermal conductivity along the film plane direction of 1950 W/mK or more, and (2) further having an area of 4 mm2 or more, and a production process thereof.

The present invention (first aspect) is the graphite sheet according to (1) or (2), having a thermal conductivity along the film plane direction of 1950 W/mK or more, and (3) having a density of 1.8 g/cm3 or more, and a production process thereof.

Further, the present invention (first aspect) is the graphite sheet according to any one of (1), (2), (3), having a thermal conductivity along the film plane direction of 1950 W/mK or more, and (4) having an average crystal grain size of 2 μm or more, and a production process thereof.

The above-mentioned graphite sheet is produced, wherein a polymer film is used as a raw material. In addition, the present invention (first aspect) is the graphite sheet according to any one of (1), (2), (3), (4), having a thermal conductivity along the film plane direction of 1950 W/mK or more, (5) wherein the polymer film as a raw material for producing the graphite sheet is an aromatic polymer, and the aromatic polymer is further preferably an aromatic polyimide, and the present invention (first aspect) is also a production process thereof.

(5) More specifically, an aromatic polymer is polyamide, polyimide, polyquinoxaline, polyoxadiazole, polybenzoimidazole, polybenzooxazole, polybenzothiazole, polyquinazolinedione, polybenzoxazinone, polyquinazolone, a benzimidazobenzophenanthroline ladder polymer, or derivatives thereof. The aromatic polyimide film is preferably prepared by combining either of pyromellitic anhydride and 3,3',4,4'-biphenyltetracarboxylic dianhydride and either of 4,4'-diaminodiphenyl ether and p-phenylenediamine, respectively.

(6) In producing the graphite film from a polymer film as a raw material, the polymer film needs to be heat-treated at a temperature of 3000° C. or higher. The polymer film is particularly preferred to be heat-treated at a temperature of 3000° C. or higher for a retention time of 20 minutes or more in an atmosphere pressurized to a gauge pressure of 0.10 MPa or more with an inert gas. A thickness of the polymer film is preferably 6 μm or less.

Solutions to the Problem of Second Aspect

Next, solutions to the problem of the second aspect will be described. In the second aspect of the present specification, the terms "film", "thin film" and "sheet" do not limit a thickness thereof, and these terms are all used in a sense of a film-like material, has the same meaning, and are distinguished from a "plate" lacking flexibility in that these have the flexibility in a thickness direction.

A basic structure of a graphite crystal is a layered structure in which base planes formed by carbon atoms bound in the form of a hexagonal network are orderly stacked (a direction in which layers are stacked is referred to as a c-axis, and a direction in which the base plane formed by carbon atoms bound in the form of a hexagonal network extends is referred to as a Basal plane (a-b plane) direction). Carbon atoms within the base plane are strongly bound with a covalent bond, and on the other hand, binding between faces of layers stacked depends on a weak Van der Waals force, and an interlayer distance is 0.3354 nm in an ideal structure. The electrical conductivity and the thermal conductivity in graphite are large in the a-b plane direction reflecting such anisotropy, and therefore the electrical conductivity and the thermal conductivity in this direction are good measures for determining graphite quality. For example, the electrical conductivity along the a-b plane direction in the highest quality graphite crystal is 24000 to 25000 S/cm.

Electronic properties of graphite is basically determined by the behavior of a π electron, and the graphite exhibits a semi-metallic property by extremely slight electrons and holes produced in the vicinity of an edge of a Brillouin zone. However, this is the case of an ideal graphite crystal, and in actuality, the number of carriers due to thermal excitation increases sensitively under the influence of impurity carriers or the like at room temperature to have an effect on electrical physical properties. The electrical conductivity of a substance is determined by a product of the carrier concentration and the carrier mobility; however, since the carrier concentration and the carrier mobility cancel each other out, and consequently the difference in electrical conductivity between graphites of high quality generally does not become so large. As previously described, since it is essential to realize the characteristic of high carrier mobility in order to prepare alternative graphite to copper wiring, it is preferred to suppress an increase of impurity carriers due to presence of impurity carriers or the like as far as possible.

First, we measured the electrical conductivity and the carrier mobility of a commercially available graphite film (manufactured by KANEKA CORPORATION: Graphinity (20 μm)) prepared by the polymer baking method. As a result of this, it was found that the graphite film prepared by the polymer baking method has a relatively high electrical conductivity (14000 S/cm) despite a relatively low carrier concentration ($1\times10^{19}$ cm−3). This teaches that the amount of impurities of the graphite film prepared by the polymer baking method is relatively small and the graphite film has excellent carrier mobility. These findings are a first point of the present invention (second aspect).

Here, a value of the carrier mobility described in the present invention (second aspect) is calculated using a Hall coefficient obtained by Hall measurement. In the case of graphite, since the numbers of holes and electrons are almost the same, a sum of a concentration of the electron and a concentration of the hole separately calculated from a 2 carrier model is taken as a carrier concentration, and the carrier mobility is calculated from the obtained carrier concentration. A method of determining the carrier mobility like this is a common method as a method of measuring a carrier mobility of a film-like test piece (Non-Patent Documents 12 and 13).

Next, investigations concerning how a value of the carrier mobility varies depending on an area to be measured (in the case of a Van der Pauw method, this area refers to a test piece area surrounded by four straight lines connecting therewith positions of four electrodes) were made. Specifically, in the case of the Graphinity (20 µm), when a measurement area was several mm2, the value of the carrier mobility indicated 5000 to 7000 cm2/V·sec, and when the measurement area was 9 mm2 or more, the value of the carrier mobility became 4000 to 6000 cm2/V·sec. The fact that the value of the carrier mobility of the graphite film prepared by the polymer baking method depends on a measurement area as described above is thought to indicate that characteristics of the resulting graphite film are nonuniform, and the second point of the present invention (second aspect) is how this non-uniformity should be improved.

Moreover, the present inventors addressed preparation of a graphite sheet in which a polyimide film was used as a raw material, and developed a method for producing graphite comprising a step of heat-treating a polyimide film with a birefringence of 0.12 or more at a temperature of 2400° C. or higher (Patent Document 14). In this method, a graphite sheet having a thickness of 20 µm or more and an electrical conductivity of 1600 S/cm or more could be obtained. However, in the case of the graphite film having a thickness of 20 µm or more obtained by this method, a value of the carrier mobility of the graphite film did not exceed 8000 cm2/V·sec in any case even in treating the film at 3200° C. (for example, refer to Comparative Examples B-9 to B-10 of the present application).

Then, the present inventors have tried to improve quality of a graphite film by preparing a thinner polymer thin-film and graphitizing the resulting thinner film, and to prepare graphite having higher carrier mobility. The reason why investigations concerning graphitization of the thinner polymer film were made is as following two points. Since a graphitization reaction of the polymer film proceeds from the film surface, it is thought that in a thin film, a graphite film of high quality with less structural irregularities of graphite can be made. Further, carbonization and graphitization of a polymer proceeds by removing various impurities including different types of elements in the polymer, and it is thought that since in the ultrathin film, such impurities are easily removed, impurities in graphite can be more reduced (that is, a carrier concentration can be lowered).

As a result of earnest investigations, it became apparent that by using an aromatic polymer typified by an aromatic polyimide as the aromatic polymer, adapting a thickness of the graphite sheet finally obtained to be in a range of more than 9.6 µm and 20 nm or more, and further preparing a graphite sheet at an ultrahigh temperature of 3000° C. or higher, an extremely high carrier mobility of 8000 cm2/V·sec or more can be realized even when the sheet is measured with an area of 9 mm2 or more, and further the present inventors found out that in the graphite sheet having such characteristics, it is possible to exceed the characteristic of current density resistance of practical copper, leading to completion of the present invention (second aspect).

That is, the present invention (second aspect) is as follows.

(1) A graphite sheet having a thickness in a range of less than 9.6 µm and 20 nm or more, an area of 9 mm2 or more, and a carrier mobility along the a-b plane direction at 25° C. of 8000 cm2/V·sec or more.

(2) The graphite sheet according to (1), having a characteristic of current density resistance of 2×106 A/cm2 or more.

(3) The graphite sheet according to (1) or (2), having a thickness of 2.1 µm or less.

(4) A graphite sheet, having a thickness of less than 9.6 µm and 20 nm or more, and being obtained by forming an aromatic polymer into a film having a thickness in a range of not more than 25 µm and not less than 30 nm and heat-treating the obtained aromatic polymer film at a temperature of 3000° C. or higher.

(5) A graphite sheet, having a thickness of 2.1 µm or less, and being obtained by forming an aromatic polymer into a film having a thickness in a range of not more than 6 µm and not less than 30 nm and heat-treating the obtained aromatic polymer film at a temperature of 3000° C. or higher.

(6) The graphite sheet according to (4) or (5), wherein a heat treatment at 3000° C. or higher is performed in an inert gas, and a gauge pressure of the inert gas is 0.09 MPa or more.

(7) The graphite sheet according to any one of (4) to (6), wherein the aromatic polymer is at least one selected from polyimide, polyamide, polyquinoxaline, polyoxadiazole, polybenzoimidazole, polybenzooxazole, polybenzothiazole, polyquinazolinedione, polybenzoxazinone, polyquinazolone, a benzimidazobenzophenanthroline ladder polymer, and derivatives thereof.

(8) A method for producing the graphite sheet according to any one of (1) to (3), wherein an aromatic polymer is formed into a film having a thickness in a range of not more than 25 µm and not less than 30 nm or a thickness in a range of not more than 6 µm and not less than 30 nm, the resulting aromatic polymer film is heat-treated at a temperature of 3000° C. or higher, and a thickness of the heat-treated film is less than 9.6 µm and 20 nm or more.

(9) The method for producing a graphite sheet according to (8), wherein a heat treatment at 3000° C. or higher is performed in an inert gas, and a gauge pressure of the inert gas is 0.09 MPa or more.

(10) The method for producing a graphite sheet according to (8) or (9), wherein the aromatic polymer is at least one selected from polyimide, polyamide, polyquinoxaline, polyoxadiazole, polybenzoimidazole, polybenzooxazole, polybenzothiazole, polyquinazolinedione, polybenzoxazinone, polyquinazolone, a benzimidazobenzophenanthroline ladder polymer, and derivatives thereof.

(11) The method for producing a graphite sheet according to (10), wherein the aromatic polymer polyimide is prepared from at least one selected from pyromellitic anhydride and 3,3',4,4'-biphenyltetracarboxylic dianhydride and at least one selected from 4,4-diaminodiphenyl ether and p-phenylenediamine.

(12) The method for producing a graphite sheet according to any one of (8) to (11), wherein an amount of a filler added in forming a film of the aromatic polymer is 0.1% by mass or less of the entire aromatic polymer film.

(13) A laminated board for wiring, wherein the graphite sheet according to any one of (1) to (7) is laminated on an insulating organic polymer film or an insulating inorganic substrate.

(14) The laminated board for wiring according to (13), wherein the graphite sheet is bonded to the insulating organic polymer film or the insulating inorganic substrate with a thermoplastic polymer.

(15) A graphite wiring material, being formed by partially removing the graphite sheet according to any one of (1) to (7).

(16) The graphite wiring material according to (15), having a width of wiring of 2 mm or less.

(17) A method for producing a wiring board, wherein the graphite wiring material according to claim 15) or (16) is formed by etching of a laser, and the laser is a carbon dioxide laser, a YAG laser, a YVO4 laser, a fiber laser or an excimer laser.

FIG. B-1 shows an example of a photograph of a cross-section of a graphite sheet obtained by a method described in paragraph 0094 of Parent Document 13. According to FIG. B-1, it is found that in the graphite sheet of Parent Document 13, a neat layer structure resulting from a graphite layer structure is not formed.

FIG. B-2 shows examples of photographs of cross-sections of graphite sheets according to the present invention (second aspect). FIG. B-2($a$) is a sectional view of a graphite sheet having a thickness of 0.7 μm, FIG. B-2($b$) is a sectional view of a graphite sheet having a thickness of 1.6 μm, and in both cases, a neat layer structure resulting from a graphite layer structure is formed, and this indicates that the resulting graphite sheet is extremely of high quality.

Appearances of nonuniformity of the surface (a thickness is nonuniform and a thin portion (white portion) is partially observed) and surface roughness respectively generated when a heat treatment is performed at 3000° C. under ordinary pressure are shown in FIGS. B-3($a$) and B-3($b$), respectively. Such surface roughness hardly becomes a problem when a film having a large thickness is graphitized or graphite is used as a thermal diffusion film. However, when the graphite film is used as a wiring material, which is an object of the present invention (second aspect), uniformity of a thickness as well as asperities on the surface become a problem, and therefore a heat treatment at 3000° C. or higher is preferably performed under pressure.

FIG. B-4 shows an example of a defect within graphite observed in a film to which 10% by mass of calcium phosphate was added as a filler of the polyimide film. Such a defect hardly becomes a problem when a thickness of the graphite sheet is large (accordingly, a thickness of the raw material polymer is large) or when the graphite sheet is used as a thermal diffusion film. However, when the graphite sheet prepared by a technique of the present invention (second aspect) is used as a wiring board, the presence of such a defect in a thin wiring circuit is not preferred since it is thought that a portion of the defect becomes a heat generating center, resulting in the breakage of the film.

FIG. B-5 shows a TEM photograph of a cross-section of a graphite sheet according to the present invention (second aspect) (Example B-4). As shown in the photograph, the graphite sheet obtained in the present invention (second aspect) exhibits a structure having extremely less structural irregularities, strains, cracks, breaks and impurities.

Effects of the Invention

First Aspect

According to the present invention (first aspect), it is possible to obtain a highly thermal conductive graphite sheet having a thickness in a range of 9.6 μm or less and more than 50 nm and a thermal conductivity along the a-b plane direction at 25° C. of 1950 W/mK or more by heat-treating a polymer film at a temperature of 3000° C. or higher. The graphite sheet according to the present invention (first aspect) can be widely used as a thermal diffusion sheet and an interlayer thermal bonding member.

Second Aspect

According to the present invention (second aspect), it is possible to prepare, by heat-treating a film of an aromatic polymer at a temperature of 3000° C. or higher (preferably under pressure), a graphite sheet having a thickness in a range of less than 9.6 μm and 20 nm or more, an area of 9 mm2 or more, and a carrier mobility along the a-b plane direction at 25° C. of 8000 cm2/V·sec or more, favorably a characteristic of current density resistance of 2×106 A/cm2 or more which exceeds that of practical copper. Further, the graphite sheet according to the present invention (second aspect) can be widely used as a graphite wiring material.

For example, the uniformity of characteristics of a graphite film can be estimated according to whether a characteristic of carrier mobility changes or not depending on an area of the graphite film whose characteristic of carrier mobility is measured. In general, since the characteristic of carrier mobility is largely affected by structural irregularities, strains, cracks, breaks, impurities and the like in the graphite film, it is difficult to realize a characteristic of high carrier mobility, for example, in an area of 3 mm×3 mm or more. However, the graphite film prepared by a method of the present invention (second aspect) has an extremely uniform characteristic, and therefore a high carrier mobility can be realized even in measurement of an area of 3 mm×3 mm or more, for example, measurement of an area of 10 mm×10 mm, and further the value of the carrier mobility hardly varies even in the case of an area of, for example, 10 cm×10 cm.

On the other hand, even in a graphite film having a thickness of 9.6 μm or more or a graphite film having a thickness of less than 20 nm, there may be cases where a high carrier mobility of 7000 cm2/V·sec or more (in some cases, 8000 cm2/V·sec) is observed when the area to be measured (measurement area) for measuring the carrier mobility is 9 mm2 or less. However, when the measurement area for measuring the carrier mobility was 9 mm2 or more, the range of a thickness in which a high carrier mobility of 8000 cm2/V·sec or more could be observed was a range of a thickness of less than 9.6 μm and 20 nm or more, which is the range of the present invention (second aspect).

Since the polymer baking method can yield graphite having a large area in the form of a film, it is an industrially very advantageous method. As previously described, in the present invention (second aspect), a value of the carrier mobility was measured using a square test piece having an area of 3 mm×3 mm or 1 cm×1 cm as a base, but the value of the carrier mobility did not so vary even when a test piece having a large area was further measured. Accordingly, in the present invention (second aspect), it is possible to easily prepare a graphite film having a size enough to form a practical circuit.

Moreover, the present inventors measured the characteristic of current density resistance of the graphite film of the present invention (second aspect), and consequently it became apparent that the graphite film having a carrier mobility of 8000 cm2/V·sec or more has a characteristic of current density resistance almost equal to or higher than that of a copper film, the graphite film having a carrier mobility of 9000 cm2/V·sec or more has a characteristic of current density resistance almost two times higher than that of the copper film, and a test piece having a carrier mobility of 10000 cm2/V·sec or more has a characteristic of current density resistance four times or more higher than that of the copper film, and it was found that according to the present invention (second aspect), a graphite wiring material capable of being alternative to copper wiring is obtained.

The graphite film of the present invention (second aspect) can be formed into a circuit without a problem in terms of processability. That is, with respect to the graphite film, a circuit pattern can be easily formed by laser-etching. The circuit formation can be performed by using, as a laser, a carbon dioxide laser, a YAG laser, a YVO4 laser, a fiber laser or an excimer laser which is for common laser processing. Further, the graphite film is also able to be etched with oxygen plasma.

Moreover, the graphite film of the present invention (second aspect) can be bonded to various insulating organic polymer films such as a polyimide film or insulating inorganic substrates, and can be formed into a circuit substrate as with copper wiring. As described above, these composites can be achieved by utilizing a technique regarding a graphite film/polymer composite film to impart insulation properties to a graphite film (Patent Documents 9 to 12) or a formation technique of a laminate without an adhesive layer, formed by directly bonding a graphite film to a polyimide (Patent Document 13).

In order to form a circuit by laser processing using a composite of the graphite film of the present invention (second aspect) and a polymer insulating film (insulating organic polymer film) or the insulating inorganic substrate, a graphite layer may be directly irradiated with laser light to etch and remove the graphite layer. It is thought that at this time, the polymer insulating film on the substrate is damaged (carbonized) by laser light, but since the graphite film of the present invention (second aspect) is very thin and has extremely excellent thermal conductivity in a film plane direction, heat for etching is promptly diffused and therefore it is possible to etch away a graphite layer without much damaging the polymer insulating film on the substrate. It is needless to say that the polymer insulating film is preferably a heat-resistant polymer, and a polyimide film, a PEN film, or the like which is representative of the heat-resistant polymer can be preferably used for this purpose.

When a circuit is formed by laser processing using a composite of the graphite film of the present invention (second aspect) and the polymer insulating film, or the like, it is preferred to use a thermoplastic polymer as an adhesive layer between these films. When such an adhesive layer is used, heat by laser processing is consumed as heat of fusion of the polymer, and therefore it is possible to avoid thermally damaging the polymer substrate.

Here, since the present invention (first aspect) and the present invention (second aspect) are technically closely associated with each other, the first aspect and the second aspect are described together in the present specification. There may be cases where in the present invention (first aspect), the effect of the present invention (second aspect) is developed. Also, there may be cases where in the present invention (second aspect), the effect of the present invention (first aspect) is developed.

BRIEF DESCRIPTION OF THE DRAWINGS

FIGS. A-1, A-2 and A-3 pertain to the first aspect, and FIGS. B-1, B-2, B-3, B-4 and B-5 pertain to the second aspect. FIG. A-1(a) shows a photograph of a surface of pyrolytic graphite, and FIG. A-1(b) shows a photograph of a cross-section of the pyrolytic graphite.

FIG. A-2(a) shows a photograph of a surface of HOPG (top-grade A), and FIG. A-2(b) shows a photograph of a surface of a graphite sheet of the present invention (first aspect).

FIG. A-3 shows a TEM photograph of a cross-section of a graphite sheet obtained in Example A-3.

FIG. B-1 shows a cross-section of a graphite sheet prepared by a method described in paragraph 0094 of Patent Document 13. A graphite film having a thickness of 2.2 µm (raw material: Upilex 7.5NS manufactured by Ube Industries, Ltd., film thickness 7.5 µm).

FIG. B-2 shows a cross-section of a graphite sheet ((a) thickness 0.7 µm, (b) thickness 1.6 µm) prepared in the present invention (second aspect).

FIG. B-3 shows examples of photographs of surfaces of graphite sheets ((a) graphite sheet having a thickness of 0.9 µm treated at 3200° C. under ordinary pressure in argon, (b) graphite sheet having a thickness of 0.9 µm treated at 3200° C. under ordinary pressure in argon) according to the present invention (second aspect).

FIG. B-4 shows a breakage of a graphite structure in the graphite sheet including a filler.

FIG. B-5 shows a TEM photograph of a cross-section of a graphite sheet according to the present invention (second aspect) (Example B-4).

MODE FOR CARRYING OUT THE INVENTION (Mode for Carrying Out the Invention of First Aspect)

Hereinafter, the present invention (first aspect) will be described in detail, but the present invention (first aspect) is not limited to the following description.

<Polymer Raw Material>

At first, a polymer film raw material to be used in the present invention (first aspect) will be described. A polymer raw material preferably used for graphite preparation of the present invention (first aspect) is preferably an aromatic polymer, and the aromatic polymer is preferably at least one selected from polyamide, polyimide, polyquinoxaline, polyoxadiazole, polybenzimidazole, polybenzoxazole, polybenzothiazole, polyquinazolinedione, polybenzoxazinone, polyquinazolone, benzimidazobenzophenanthroline ladder polymer, and derivatives thereof. The films of these polymers may be produced by a publicly known method. As a particularly preferred aromatic polymer, aromatic polyimides, polyparaphenylene vinylene, and polyparaphenylene oxadiazole can be exemplified. Among these polymers, below-described aromatic polyimides made from acid dianhydrides (particularly, aromatic acid dianhydrides) and diamines (particularly, aromatic diamines) and passed through polyamic acid are particularly preferred as a raw material polymer for graphite preparation of the present invention (first aspect).

Examples of the acid dianhydride capable of being used for synthesizing an aromatic polyimide film which is preferred for graphite preparation of the present invention (first aspect) include a pyromellitic anhydride, 2,3,6,7-naphthalenetetracarboxylic dianhydride, 3,3',4,4'-biphenyltetracarboxylic dianhydride, 1,2,5,6-naphthalenetetracarboxylic dianhydride, 2,2',3,3'-biphenyltetracarboxylic dianhydride, 3,3',4,4'-benzophenonetetracarboxylic dianhydride, 2,2-bis (3,4-dicarboxyphenyl)propane dianhydride, 3,4,9,10-perylenetetracarboxylic dianhydride, bis(3,4-dicarboxyphenyl)propane dianhydride, 1,1-bis(2,3-dicarboxypheny)

ethane dianhydride, 1,1-bis(3,4-dicarboxyphenyl)ethane dianhydride, bis(2,3-dicarboxyphenyl)methane dianhydride, bis(3,4-dicarboxyphenyl)ethane dianhydride, oxydiphthalic dianhydride, bis(3,4-dicarboxyphenyl)sulfonic dianhydride, p-phenylenebis(trimellitic acid monoester acid anhydride), ethylenebis(trimellitic acid monoester acid anhydride), bisphenol A bis(trimellitic acid monoester acid anhydride), and analogs thereof. These dianhydrides may be used singly or may be used as a mixture formed by mixing these dianhydrides in a certain ratio. Particularly because the more a polyimide film has a polymer structure having an extremely rigid structure, the higher the orientation of the polyimide film becomes, and further from the viewpoint of availability, the pyromellitic anhydride and 3,3',4,4'-biphenyltetracarboxylic dianhydride are particularly preferred.

Examples of the diamine capable of being used for synthesizing a polyimide in the present invention (first aspect) include 4,4'-diaminodiphenyl ether, p-phenylenediamine, 4,4'-diaminodiphenyl propane, 4,4'-diaminodiphenyl methane, benzidine, 3,3'-dichlorobenzidine, 4,4'-diaminodiphenyl sulfide, 3,3'-diaminodiphenyl sulfone, 4,4'-diaminodiphenyl sulfone, 4,4'-diaminodiphenyl ether, 3,3'-diaminodiphenyl ether, 3,4'-diaminodiphenyl ether, 1,5-diaminonaphthalene, 4,4'-diaminodiphenyl diethyl silane, 4,4'-diaminodiphenyl silane, 4,4'-diaminodiphenyl ethyl phosphine oxide, 4,4'-diaminodiphenyl N-methylamine, 4,4'-diaminodiphenyl N-phenylamine, 1,4-diaminobenzene (p-phenylenediamine), 1,3-diaminobenzene, 1,2-diaminobenzene, and analogs thereof. These diamines may be used singly or may be used as a mixture formed by mixing these diamines in a certain ratio. Moreover, from the viewpoint of enhancing of the orientation of a polyimide film and availability, a polyimide is particularly preferably synthesized by using 4,4'-diaminodiphenyl ether or p-phenylenediamine as a raw material.

As a method for producing polyamic acid to be used in the present invention (first aspect), a publicly known method can be used, and the polyamic acid is usually produced by dissolving at least one of aromatic acid dianhydrides and at least one of diamines in an organic solvent, and stirring the resulting raw material solution in a controlled temperature condition until polymerization of the above-mentioned acid dianhydride and diamine is completed. These polyamic acid solutions are commonly produced with a concentration in 5 to 35% by mass, preferably 10 to 30% by mass. When the solution has a concentration in this range, it is possible to achieve an appropriate molecular weight and an appropriate solution viscosity.

The acid dianhydride and the diamine in the raw material solution are preferably substantially equal in molar amount to each other, and a mole ratio is, for example, 1.5:1 to 1:1.5, preferably 1.2:1 to 1:1.2, and more preferably 1.1:1 to 1:1.1.

<Synthesis of Polyimide, Film Formation>

Examples of a method for producing a polyimide include a thermal cure method in which polyamic acid of a precursor is imidized by heating, and a chemically curing method in which both or one of a dehydrating agent typified by acid anhydrides such as acetic anhydride and tertiary amines such as picoline, quinoline, isoquinoline and pyridine, is used as an imidization accelerator for polyamic acid to perform imidization, and any of these methods may be employed. The chemically curing method is preferred because the resulting film has a small linear expansion coefficient and a high elastic modulus, its birefringence easily becomes large and the film is able to attain graphite of good quality without breaking even though tension is applied to the film during baking the film.

The highly thermal conductive graphite sheet of the present invention (first aspect) has a thickness in a range of 9.6 μm or less and more than 50 nm, and in order to obtain a graphite sheet having a thickness in such a range, a thickness of a polymer film as a raw material is preferably in a range of 18 μm to 120 nm. This depends on the fact that a thickness of the graphite sheet finally obtained is commonly often about 60 to 30% of a thickness of a starting polymer film having a thickness of 1 μm or more and about 50 to 20% of a thickness of a starting polymer film having a thickness of 1 μm or less. Accordingly, this means that in order to obtain a graphite sheet of the present invention (first aspect) having a thickness which is finally 9.6 μm or less and more than 50 nm, the thickness of a starting polymer film is preferably in a range of not more than 30 μm and not less than 100 nm. The thickness of the polymer film may be, for example, 20 μm or less, more preferably 10 μm or less, particularly preferably 6 μm or less, most preferably 4 μm or less. On the other hand, the dimension of the polymer film is often shrunk to 100 to 70% of an original dimension in a length direction.

The polymer film can be produced from the above polymer raw material or a synthesized raw material thereof by various publicly known techniques. For example, the polyimide film of the present invention (first aspect) is produced by casting the above-mentioned organic solvent solution of polyamic acid of a polyimide precursor on a support such as an endless belt or a stainless steel drum, drying and imidizing the solution. Specifically, a method for producing a film by chemically curing is as follows. First, to the polyamic acid solution, a stoichiometric amount or more of a dehydrating agent and a catalytic amount of an imidization accelerator are added, and the resulting mixture is cast or applied onto a supporting plate, an organic film such as PET, or a support such as a drum or an endless belt to form a film, and a film having a self-supporting property is obtained by evaporating an organic solvent. Then, the obtained film is imidized while further heating to dry to obtain a polyimide film. A temperature during heating is preferably in a range of 150° C. to 550° C. Moreover, a production process of a polyimide preferably includes a step of fixing or stretching a film in order to prevent shrinkage of a film. This depends on the fact that when a film in which a molecular structure and its higher structure are controlled is used, conversion to graphite easily proceeds. That is, while carbon molecules in a carbon precursor need to be rearranged in order to allow the graphitization reaction to proceed smoothly, it is guessed that a polyimide having excellent orientation is easily converted to graphite even at low temperature since it requires only minimum rearrangement for graphitization.

<Carbonization and Graphitization>

Next, techniques of carbonizing/graphitizing a polymer film typified by a polyimide will be described. In the present invention (first aspect), a polymer film of a starting material is preheated in an inert gas to perform carbonization. As the inert gas, nitrogen, argon or a mixed gas of argon and nitrogen is preferably used. Preheating is usually performed at about 1000° C. In general, the polyimide film is thermally decomposed at about 500 to 600° C. and carbonized at about 1000° C. It is effective to apply such a level of a pressure in a plane direction that break of the film does not occur at the stage of the pretreatment to avoid losing orientation of the starting polymer film.

The film carbonized by the above method is set at the inside of a high-temperature furnace and graphitization is performed. The carbonized film is preferably set up with being sandwiched between CIP materials or glassy carbon substrates. Graphitization is usually performed at a high temperature of 2600° C. or higher or 2800° C. or higher, and in order to achieve such a high temperature, an electric current is usually passed directly through a graphite heater, and heating is performed with use of Joule heat thereof. The graphitization is carried out in an inert gas, and an argon gas is most suitable as the inert gas, and a small amount of helium may be added to argon. The higher a treatment temperature is, the better graphite the film can be converted to. It is often the case that a polyimide film is shrunk to reduce the original area thereof by about 10 to 40% by thermal decomposition and carbonization, and is enlarged by about 10% by contraries during the process of graphitization. Internal stress is generated within a graphite sheet due to such shrinkage and expansion to cause a strain within the graphite sheet. Such strain or internal stress is mitigated by treating at 3000° C. or higher, and therefore layers of graphite are orderly arranged, and further the thermal conductivity is increased. In order to obtain the graphite of the present invention (first aspect), a treatment temperature of 2600° C. is insufficient, and the treatment temperature is preferably 3000° C. or higher, more preferably 3100° C. or higher, and most preferably 3200° C. or higher. Naturally, this treatment temperature may be designated as a maximum treatment temperature in the process of graphitization, or the resulting graphite sheet may be reheated in the form of annealing. In addition, an upper limit of the heat treatment temperature is, for example, 3700° C. or lower, preferably 3600° C. or lower, and more preferably 3500° C. or lower. A retention time at the treatment temperature is, for example, 20 minutes or more, and preferably 30 minutes or more, and it may be 1 hour or more. An upper limit of the retention time is not particularly limited; however, it is usually 5 hours or less and it may be particularly about 3 hours or less. When the carbonized film is graphitized by heat-treating at a temperature of 3000° C. or higher, it is preferred to apply a pressure to an atmosphere in a high-temperature furnace with use of the above-mentioned inert gas. When the heat treatment temperature is high, sublimation of carbon from the sheet surface begins to cause a deterioration phenomenon such as an increase of holes or cracks on the graphite sheet surface and a reduction of film thickness, but such a deterioration phenomenon can be prevented through the application of pressure and therefore an excellent graphite sheet can be obtained. An atmospheric pressure (gauge pressure) in a high-temperature furnace using the inert gas is, for example, 0.10 MPa or more, preferably 0.12 MPa or more, and more preferably 0.14 MPa or more. An upper limit of the atmospheric pressure is not particularly limited, and for example, it may be 2 MPa or less, and particularly about 1.8 MPa or less.

<Characteristic of Highly Thermal Conductive Graphite Sheet>

From the viewpoint that higher thermal conductivity is easily achieved as a thickness of the graphite sheet according to the present invention (first aspect) is reduced, the thickness of the graphite sheet is preferably 9.6 μm or less. This is conceivable as follows. That is, in the graphite sheet production based on the polymer baking method, with respect to a graphitization reaction, it is thought that a graphite structure is formed at the outermost surface layer of a polymer-carbonized sheet, and the graphite structure grows toward the inside of the film. When the thickness of the graphite sheet is increased, the graphite structure within the carbonized sheet is disordered during graphitization, and voids and defects are easily generated. Contrariwise, when the thickness of the sheet is decreased, the graphitization proceeds into the film with the graphite layer structure at the sheet surface ordered, and consequently an ordered graphite structure is easily produced throughout the sheet. It is thought that since as described above, the graphite layer structure is ordered, the graphite sheet exhibits the high thermal conductivity.

On the other hand, in the preparation method of the present invention (first aspect), it is hard to develop the high thermal conductivity when the thickness of the graphite sheet is 50 nm or less. The reason for this is not necessarily clear, and when the thickness of the graphite sheet prepared by a method of the present invention (first aspect) is 50 nm or less, the graphite sheet is rich in flexibility but lacks elasticity. Since it is known that most of heat conduction of a graphite sheet occurs due to lattice vibration (phonon), it is estimated that a reduction in the elasticity of the film interferes with development of the high thermal conductivity. It is difficult to prepare a graphite sheet having a thickness of 50 nm or less and being rich in elasticity. As described above, the graphite sheet of the present invention (first aspect) has a thickness in a range of 9.6 μm or less and more than 50 nm, preferably 7.5 μm or less and more than 50 nm, more preferably 6.5 μm to 100 nm, moreover preferably 5.0 μm to 100 nm, particularly preferably 3.0 μm to 200 nm and most preferably 2.0 μm to 200 nm. It is not preferred that the thickness of the graphite sheet is more than 9.6 μm, since the graphite structure within the carbonized sheet is disordered during graphitization, and voids and defects may be easily generated. Further, it is not preferred that thickness is 50 nm or less, since the sheet is rich in flexibility but lacks elasticity, and this may interfere with development of the high thermal conductivity.

Moreover, interestingly, in the highly thermal conductive graphite sheet according to the present invention (first aspect), it was found that the area of a sheet has also an effect on the thermal conductivity as with the thickness of a sheet. Specifically, a graphite sheet area of the present invention (first aspect) is preferably 4 mm2 or more, and more preferably 10 mm2 or more. The sheet area referred to herein is determined based on the following investigations. That is, first, we prepared a square-shaped sheet and measured its thermal conductivity. When a shape of the sheet was square-shaped, it was possible to develop a high thermal conductivity exceeding 1950 W/mK in the test piece with an area of 4 mm2 or more; however, for example, in the test piece with an area of 2.25 mm2, it was difficult to exceed a thermal conductivity of 1950 W/mK. Similarly, in the rectangular test piece with an area of 4 mm2, it was possible to exceed a high thermal conductivity of 1950 W/mK; however, in the test piece with an area of 3 mm2 or 2 mm2, it was difficult to exceed a thermal conductivity of 1950 W/mK. From these results, it was concluded that an area of the test piece is preferably 4 mm2 or more in order to develop high thermal conductivity according to the technique of the present invention (first aspect).

Although it is commonly hard to understand that as described above, a value of the thermal conductivity of a graphite sheet varies with the size of a test piece, in recent years, the thermal conductivity of graphene or a graphite flake in a μm size was measured, and consequently it is reported that in test pieces of the graphene or the graphite flake, the thermal conductivity of the test piece varies with the size of the test piece. This is explained to be due to the fact that thermal conduction is interfered with by reflection of phonon at a test piece end face. It is thought that high thermal conductivity of the graphite sheet of the present invention (first aspect) is largely by phonon. Accordingly, it is thought that the thermal conductivity is also reduced by reflection of phonon at a test piece end face in the case of the highly thermal conductive graphite sheet of the present invention (first aspect) as with the above graphene or graphite flake. However, in the above graphene or graphite flake, the effect of improving the thermal conductivity appears in the test piece of a μm size, and on the other hand, the present invention (first aspect) largely differs from the graphene or graphite flake in that the effect on the thermal conductivity appears in the test piece of a millimeter (mm) size. This is completely new findings, and is a point of the present invention (first aspect). In addition, an area of the graphite sheet is not particularly limited as long as a test piece with an area of 4 mm2 or more can be cut out, and for example, it may be 100 cm2 or more, 150 mm2 or more, or 200 mm2 or more. An upper limit of the sheet area is not particularly limited, and for example, it may be 1000 mm2 or less, or 500 mm2 or less.

A density of the graphite sheet according to the present invention (first aspect) is preferably 1.8 g/cm3 or more. In general, a highly thermal conductive graphite sheet has such a very dense structure that defects or voids are not present in the sheet. When a graphite sheet has defects or voids, the density of the graphite sheet is lowered and the thermal conductivity tends to decrease. From this, the density of the graphite sheet is preferably high, i.e. preferably 1.80 g/cm3 or more, more preferably 2.0 g/cm3 or more, and most preferably 2.1 g/cm3 or more. An upper limit of the density is 2.26 g/cm3 or less, and may be 2.20 g/cm3 or less.

In order to realize high thermal conductivity according to the present invention (first aspect), the average crystal grain size (domain size) of the graphite is preferably 2 μm or more, more preferably 3 μm or more, and most preferably 4 μm or more. It is commonly known that the thermal conductivity is improved when a crystal grain size increases. The reason for this is that phonons contributing to heat conduction are scattered at a crystal grain boundary and scattering of phonons is reduced as a grain size is increased. It is known that a currently reported average crystal grain size of highly oriented pyrolytic graphite (HOPG) is 5 to 20 μm, and the thermal conductivity thereof is 1800 to 1950 W/mK. Accordingly, this appears to be conflicted with a description that the average crystal grain size of graphite having a high thermal conductivity exceeding 1950 W/mK may be 2 μm or more.

However, this can be explained as follows. That is, it is known that with respect to graphite, an average crystal grain size is proportional to the thermal conductivity in the case of graphite relatively low in quality in which a domain size is 520 nm or less, but in graphite of high quality, scattering of phonons does not depend on such a small crystal grain size. This is construed to be due to the fact that in the graphite of high quality, most of scattering becomes only scattering referred to as an umklapp process (Non-Patent Document 4). This shows that when a domain size of the highly thermal conductive graphite sheet of the present invention (first aspect) is 2 μm or more, an excellent characteristic of a thermal conduction of 1950 W/mK or more can appear sufficiently.

Moreover, in the case of the HOPG, the graphite sheet is prepared by supplying an organic gas such as methane to a heated substrate, growing pyrolytic graphite from the organic gas in a vapor phase, and further treating the pyrolytic graphite at a high temperature. It is known that since the pyrolytic graphite grows in the shape of a pillar, large columnar grain boundaries are present within the HOPG. A photograph of a surface of the pyrolytic graphite is shown in FIG. A-1(a), and a photograph of a cross-section of the pyrolytic graphite is shown in FIG. A-1(b). A whole surface of the graphite is covered with a structure with asperities, and large columnar grain boundary structures are observed in a cross-section. HOPG is prepared by further treating the pyrolytic graphite having such a structure at a high temperature, but the grain boundary structure is not completely vanished even by a high-temperature treatment.

FIG. A-2(a) shows a SEM photograph of a surface of HOPG (top-grade A). In this photograph, a structure thought to be apparently based on the above-mentioned grain boundary is observed, and therefore it is found that a columnar grain boundary structure at the time of preparing the pyrolytic graphite remains in the HOPG. Such a large grain boundary structure present in the HOPG is thought to cause the thermal conductivity of the HOPG to decrease in contrast to the above-mentioned so-called crystal average grain size (domain). On the other hand, FIG. A-2(b) shows a SEM photograph (magnification 1000 times) of a surface of the graphite sheet of the present invention (first aspect), in which a grain boundary structure as observed in the HOPG is not observed. That is, in the case of the highly thermal conductive graphite sheet of the present invention (first aspect), large thermal conductivity is thought to be developed even though its average crystal grain size is smaller than that of the HOPG since such a grain boundary structure is not present.

The average crystal grain size (domain size) of the graphite of the present invention (first aspect) may be, for example, 10 μm or less, 7 μm or less, or 5 μm or less. Further, the average crystal grain size (domain size) is, for example, 0.1 times or more, preferably 1 time or more, and more preferably 2 times or more larger than a thickness of the graphite sheet.

Further, the graphite sheet of the present invention (first aspect) has a thermal conductivity along the a-b plane direction at 25° C. of 1950 W/mK or more, and the thermal conductivity is preferably 1960 W/mK or more, more preferably 2000 W/mK or more, moreover preferably 2050 W/mK or more, particularly preferably 2080 W/mK or more, and most preferably 2100 W/mK or more. Further, the thermal conductivity may be, for example, 2400 W/mK or less, or may be 2300 W/mK or less.

The graphite sheet of the present invention (first aspect) can be suitably used for a heat dissipation use, and is useful for producing a graphite material to be used for such a use.

(Second Aspect)

Next, hereinafter, the present invention (second aspect) will be described in detail, but the present invention (second aspect) is not limited to the following description.

<Polymer Raw Material>

At first, a polymer film raw material to be used for graphite sheet preparation of the present invention (second aspect) will be described. A polymer raw material preferably used for graphite sheet preparation of the present invention (second aspect) is preferably an aromatic polymer, and the aromatic polymer is preferably at least one selected from polyamide, polyimide, polyquinoxaline, polyoxadiazole, polybenzimidazole, polybenzoxazole, polybenzothiazole, polyquinazolinedione, polybenzoxazinone, polyquinazolone, benzimidazobenzophenanthroline ladder polymer, and derivatives thereof. The films of these polymers may be produced by a publicly known method.

As a particularly preferred aromatic polymer, aromatic polyimides can be exemplified. Among these polymers, below-described aromatic polyimides made from acid dianhydrides (particularly, aromatic acid dianhydrides) and diamines (particularly, aromatic diamines) and passed through polyamic acid are particularly preferred as a raw material polymer for graphite preparation of the present invention (second aspect).

The graphite sheet of the present invention (second aspect) may be obtained, for example, by forming an aromatic polymer into a film having a thickness in a range of not more than 25 μm and not less than 30 nm or a thickness in a range of not more than 6 μm and not less than 30 nm, and heat-treating the resulting aromatic polymer film at a temperature of 3000° C. or higher.

<Synthesis and Film Formation of Aromatic Polyimide>

Hereinafter, a preparation method of an aromatic polyimide film which is particularly preferred as a polymer raw material in the present invention (second aspect) will be described in detail. Examples of the acid dianhydride capable of being used for synthesizing an aromatic polyimide film include a pyromellitic anhydride, 2,3,6,7-naphthalenetetracarboxylic dianhydride, 3,3',4,4'-biphenyltetracarboxylic dianhydride, 1,2,5,6-naphthalenetetracarboxylic dianhydride, 2,2',3,3'-biphenyltetracarboxylic dianhydride, 3,3',4,4'-benzophenonetetracarboxylic dianhydride, 2,2-bis(3,4-dicarboxyphenyl)propane dianhydride, 3,4,9,10-perylenetetracarboxylic dianhydride, bis(3,4-dicarboxyphenyl)propane dianhydride, 1,1-bis(2,3-dicarboxypheny)ethane dianhydride, 1,1-bis(3,4-dicarboxyphenyl)ethane dianhydride, bis(2,3-dicarboxyphenyl)methane dianhydride, bis(3,4-dicarboxypheny)ethane dianhydride, oxydiphthalic dianhydride, bis(3,4-dicarboxyphenyl)sulfonic dianhydride, p-phenylenebis(trimellitic acid monoester acid anhydride), ethylenebis(trimellitic acid monoester acid anhydride), bisphenol A bis(trimellitic acid monoester acid anhydride), and analogs thereof. These dianhydrides may be used singly or may be used as a mixture formed by mixing these dianhydrides in a certain ratio. Particularly because the more a polyimide film has a polymer structure having a linear and rigid structure, the higher the orientation of the polyimide film becomes, and further from the viewpoint of availability, the pyromellitic anhydride and 3,3',4,4'-biphenyltetracarboxylic dianhydride are particularly preferred.

Examples of the diamine capable of being used for synthesizing aromatic polyimide in the present invention (second aspect) include 4,4'-diaminodiphenyl ether, p-phenylenediamine, 4,4'-diaminodiphenyl propane, 4,4'-diaminodiphenyl methane, benzidine, 3,3'-dichlorobenzidine, 4,4'-diaminodiphenyl sulfide, 3,3'-diaminodiphenyl sulfone, 4,4'-diaminodiphenyl sulfone, 4,4'-diaminodiphenyl ether, 3,3'-diaminodiphenyl ether, 3,4'-diaminodiphenyl ether, 1,5-diaminonaphthalene, 4,4'-diaminodiphenyl diethyl silane, 4,4'-diaminodiphenyl silane, 4,4'-diaminodiphenyl ethyl phosphine oxide, 4,4'-diaminodiphenyl N-methylamine, 4,4'-diaminodiphenyl N-phenylamine, 1,4-diaminobenzene (p-phenylenediamine), 1,3-diaminobenzene, 1,2-diaminobenzene, and analogs thereof. These diamines may be used singly or may be used as a mixture formed by mixing these diamines in a certain ratio. Moreover, from the viewpoint of enhancing of the orientation of a polyimide film and availability, an aromatic polyimide is preferably synthesized by using 4,4'-diaminodiphenyl ether or p-phenylenediamine as a raw material.

From the above description, the polyimide of an aromatic polymer may be prepared from at least one selected from between pyromellitic anhydride and 3,3',4,4'-biphenyltetracarboxylic dianhydride and at least one selected from between 4,4-diaminodiphenyl ether and p-phenylenediamine.

As a method for producing polyamic acid to be used in the present invention (second aspect), a publicly known method can be used, and the polyamic acid is usually produced by dissolving at least one of aromatic acid dianhydrides and at least one of diamines in an organic solvent, and stirring the resulting raw material solution in a controlled temperature condition until polymerization of the above-mentioned acid dianhydride and diamine is completed. These polyamic acid solutions are commonly produced with a concentration in 5 to 35% by mass, preferably 10 to 30% by mass. When the solution has a concentration in this range, it is possible to achieve an appropriate molecular weight and an appropriate solution viscosity.

The acid dianhydride and the diamine in the raw material solution are preferably substantially equal in molar amount to each other, and a mole ratio is, for example, 1.5:1 to 1:1.5, preferably 1.2:1 to 1:1.2, and more preferably 1.1:1 to 1:1.1.

Examples of a method for producing an aromatic polyimide include a thermal cure method in which polyamic acid of a precursor is imidized by heating, and a chemically curing method in which both or one of a dehydrating agent typified by acid anhydrides such as acetic anhydride and tertiary amines such as picoline, quinoline, isoquinoline and pyridine is used as an imidization accelerator for polyamic acid to perform imidization The chemically curing method is preferred in order to realize a graphite sheet having a characteristic of high carrier mobility and a characteristic of high current density resistance of the present invention (second aspect). In the thermal cure method, the occurrence of a reverse reaction of forming amide acid between 150° C. and 200° C. which is referred to as a depolymerization reaction, cannot be avoided, but in the chemically curing method, the depolymerization reaction hardly occurs, and a polyimide in which a sequential arrangement is controlled is easily prepared. Therefore, it is thought that a polyimide film of a thin film formed by the chemically curing method has higher orientation and easily provides good graphite.

The graphite sheet of the present invention (second aspect) has a thickness in a range of less than 9.6 μm and 20 nm or more. When an aromatic polyimide is used, the thickness of a starting polymer film is preferably in a range of not more than 25 μm and not less than 30 nm or in a range of not more than 6 μm and not less than 30 nm because a thickness of the graphite sheet finally obtained is commonly in a range of 80 to 30% of a thickness of a starting polymer film, and a reduction percentage of a thickness of the starting polymer film commonly tends to increase as the thickness of the polymer film is reduced. The thickness of the polymer film may be, for example, 25 μm or less, more preferably 20 μm or less, further preferably 15 μm or less, moreover preferably 10 μm or less, particularly preferably 6 μm or less, and most preferably 4 μm or less. The thickness of the polymer film may be, for example, 30 nm or more, more preferably 50 nm or more, moreover preferably 70 nm or more, particularly preferably 100 nm or more, and most preferably 200 nm or more. On the other hand, since the dimension of the polymer film is often shrunk to about 100 to 70% of an original dimension in a length direction, an area of the sheet to be produced may be de determined in consideration of this condition. The polymer film can be produced from the above polymer raw material or a synthesized raw material thereof by various publicly known techniques. In order to prepare such an ultrathin film of a polymer film, methods of preparing a thin film on a substrate such as an endless belt, a drum or a metal film by a wire bar, methods of preparing a thin film by spin coating or methods of preparing a thin film in vacuum in which reaction is generated by vapor deposition in vacuum can be preferably employed. In addition, it is preferred in the present invention (second aspect) that a wire bar is used for obtaining a sheet of 50 to 1 μm in thickness, and spin coating is used for obtaining a sheet of 1 μm to 20 nm in thickness.

Hereinafter, an example of a preparation method of an aromatic polyimide thin film of the present invention (second aspect) will be described. The polyimide thin film of the present invention (second aspect) is produced by casting the above-mentioned organic solvent solution of polyamic acid of a polyimide precursor on a support such as an endless belt or a stainless steel drum, drying and imidizing the solution. Specifically, a method for producing a film by chemically curing is as follows. First, to the polyamic acid solution, a stoichiometric amount or more of a dehydrating agent and a catalytic amount of an imidization accelerator are added, and the resulting mixture is cast or applied onto a supporting plate, an organic film such as PET, or a support such as a drum or an endless belt, formed into a thin film with use of a wire bar or spin coater, and a film having a self-supporting property is obtained by evaporating an organic solvent. Then, the obtained film is imidized while further heating to dry to obtain a polyimide film. A temperature during heating is preferably in a range of 150° C. to 550° C. Moreover, a production process of a polyimide preferably includes a step of fixing or stretching a film in order to prevent shrinkage of a film. This depends on the fact that when a film in which a molecular structure and its higher structure are controlled is used, conversion to graphite easily proceeds. That is, while carbon molecules in a carbon precursor need to be rearranged in order to allow the graphitization reaction to proceed smoothly, it is guessed that a polyimide having excellent orientation is easily converted to graphite even at low temperature since it requires only minimum rearrangement for graphitization.

When the aromatic polyimide thin film is prepared, a powder referred to as a filler is commonly added for preventing electrification and bonding to a substrate during forming a film or for facilitating winding of a film at the time of mass production. A most commonly used filler is calcium phosphate, and the filler is usually added in an amount of about 10 to 1% by mass of the entire polyimide and a particle size of the filler is often about 3 to 1 μm. A melting point of calcium phosphate is 1230° C., and it does not become a problem that an ordinary polyimide film includes a filler. Also, when a thickness of a polyimide thin film is 25 μm or more and a graphite sheet is prepared using the thin film, the filler hardly affects the characteristics of the graphite sheet finally obtained since the filler is decomposed and gasified. However, it became apparent that in the graphite sheet having a thickness of less than 9.6 μm of the present invention (second aspect), the filler adversely affects the realization of a carrier mobility of 8000 cm2/V·sec or more. Specifically, in the case of a thin graphite sheet like the present invention (second aspect), a trace of the filler decomposed/gasified to escape in the process of carbonization interferes with formation of a graphite layer in the process of graphitization, and hence adversely affects realization of a carrier characteristic and the characteristic of current density resistance. Accordingly, in the present invention (second aspect), it is preferred not to contain the filler typified by calcium phosphate as far as possible.

In the present invention (second aspect), it is preferred that an amount of a filler to be added at the time of forming a film of the above-mentioned aromatic polymer is preferably 0.1% by mass or less of the entire aromatic polymer film, and it is most preferred not to substantially contain a filler.

<Carbonization and Graphitization Reaction>

Next, techniques of carbonizing/graphitizing a polymer film typified by an aromatic polyimide will be described. In the present invention (second aspect), a polymer film of a starting material is preheated in an inert gas to perform carbonization. As the inert gas, nitrogen, argon or a mixed gas of argon and nitrogen is preferably used. Preheating is usually performed at about 1000° C. In general, the polyimide film is thermally decomposed at about 500 to 600° C. and carbonized at about 1000° C. It is effective to apply such a level of a pressure in a plane direction that break of the film does not occur at the stage of the pretreatment to avoid losing orientation of a starting polymer film.

The graphitization reaction is performed by setting the film carbonized by the above method at the inside of an ultrahigh temperature furnace. The carbonized film is preferably set up with being sandwiched between CIP materials or glassy carbon substrates. Graphitization is usually performed at a high temperature of 2800° C. or higher; however, in the present invention (second aspect), it is preferred to graphitize the carbonized film at a temperature of 3000° C. or higher. In order to achieve such a high temperature, an electric current is usually passed directly through a graphite heater, and heating is performed with use of Joule thereof. The graphitization is carried out in an inert gas, and an argon gas is most suitable as the inert gas, and a small amount of helium may be added to argon. The higher a treatment temperature is, the better graphite the film can be converted to. It is often the case that a polyimide film is shrunk to reduce the original area thereof by about 10 to 40% by thermal decomposition and carbonization, and the area is enlarged by about 10% by contraries during the process of graphitization. Internal stress is generated within a graphite sheet due to such shrinkage and expansion to cause a strain within the graphite sheet. Such strain or internal stress is mitigated by treating at 3000° C. or higher, and therefore layers of graphite are orderly arranged, and further the carrier mobility and the current density resistance are increased. In order to obtain the graphite sheet of the present invention (second aspect), a treatment temperature of 2800° C. is insufficient, and the treatment temperature (maximum treatment temperature) is preferably 3000° C. or higher, more preferably 3100° C. or higher, and most preferably 3200° C. or higher. Naturally, this treatment temperature may be designated as a maximum treatment temperature in the process of graphitization, or the resulting graphite sheet may be reheated in the form of annealing. In addition, an upper limit of the heat treatment temperature is, for example, 3600° C. or lower, and more preferably 3500° C. or lower. A retention time at the maximum treatment temperature is, for example, 20 minutes or more, and preferably 30 minutes or more, and it may be 1 hour or more. An upper limit of the retention time is not particularly limited; however, it is usually 8 hours or less and it may be particularly about 4 hours or less. When the carbonized film is graphitized by heat-treating at a temperature of 3000° C. or higher, it is preferred to apply a pressure to an atmosphere in a high-temperature furnace with use of the above-mentioned inert gas.

The graphite sheet of the present invention (second aspect) may be obtained under the conditions in which a heat treatment at 3000° C. or higher is performed in an inert gas, and an atmospheric pressure (gauge pressure) of the inert gas is 0.09 MPa or more (preferably 0.10 MPa or more). At this time, an upper limit of the atmospheric pressure (gauge pressure) is not particularly limited, and for example, it may be 5 MPa or less.

The reason why graphitization is performed under pressure includes three points of (1) preventing a thickness from being nonuniform due to a treatment under pressure, (2) preventing a surface becoming rough, and (3) realizing a longer service life of a heater of a heat-treating furnace. For example, when a sheet is heat-treated at a temperature of 3000° C. or higher under a pressure of 0.09 MPa or less, there may be cases where carbon is easily sublimated from the sheet, a sheet surface is fuzzed, and a thickness of graphite is nonuniformly reduced. When an extremely thin graphite sheet like the present invention (second aspect) is prepared, it is important that a thickness is uniformly reduced throughout the whole sheet, and it is important to perform a heat treatment at a temperature of 3000° C. or higher under pressure in order to uniform the thickness.

<Preparation of Graphite Film Having High Carrier Mobility and High Current Density Resistance>

The graphite film according to the present invention (second aspect) preferably has a thickness of less than 9.6 µm, and more preferably 5 µm or less from the viewpoint that with a thickness in a specific range, the graphite film has an excellent characteristic of carrier mobility and can realize a characteristic of current density resistance higher than that of copper. The reason why a high carrier mobility and a high current density resistance can be realized in the graphite film having such a thickness is thought as follows. That is, in the graphite sheet production based on the polymer baking method, with respect to a graphitization reaction, it is thought that first, a graphite structure is formed at the outermost surface layer of a polymer-carbonized sheet, and the graphite structure grows toward the inside of the film. When the thickness of the graphite sheet is increased, the graphite structure is disordered within the sheet while a graphitization reaction proceeds, and voids and defects are easily generated. Contrariwise, when the thickness of the sheet is decreased, the graphitization proceeds into the film with the graphite layer structure at the sheet surface ordered, and consequently an ordered graphite structure is easily produced throughout the sheet. Therefore, the graphite film in which a layer structure is ordered is thought to exhibit a characteristic of high carrier mobility and a characteristic of high current density resistance.

On the other hand, in the present invention (second aspect), it is not that the thinner the thickness of the graphite film is, the better it is, and the graphite film becomes hard to develop the characteristic of a high carrier mobility of 8000 cm2/V·sec or more and the characteristic of high current density resistance when its thickness is less than 20 nm. The reason for this is not necessarily clear, and we have an assumption that a reason for this is that when the thickness of the graphite film prepared by the polymer baking method is less than 20 nm, the occurrence of strains or wrinkle becomes remarkable, and the introduction of strains resulting from wrinkle cannot be avoided. Second reason includes the fact that as described above, it is extremely difficult to prepare a graphite film having a uniform thickness in treating film at a temperature of 3000° C. or higher. Since in a wiring circuit, a resistance value of the circuit needs to be uniform, uniformity of a thickness is a necessary condition. Accordingly, the graphite film of the present invention (second aspect) has a thickness in a range of less than 9.6 µm and 20 nm or more, more preferably in a range of 8 µm to 50 nm, furthermore preferably in a range of 6 µm to 100 nm, moreover preferably in a range of 2.1 µm to 200 nm, particularly preferably in a range of 1.8 µm to 350 nm, and most preferably in a range of 1.5 µm to 750 nm. When the thickness of the graphite sheet is 9.6 µm or more, it is not preferred since the graphite structure within the sheet tends to be disordered during graphitization, and voids and defects may be easily generated.

Moreover, with respect to the characteristic of carrier mobility of the graphite film of the present invention (second aspect), its measurement result is affected not only by film's thickness but also by film's area. Specifically, when a measurement area for measuring the carrier mobility is less than 9 mm2, there may be cases where a high carrier mobility of 8000 cm2/V·sec or more can be observed even in graphite films having a thickness of 9.6 µm or more or having a thickness of less than 20 nm which are treated at a high temperature of 3000° C. or higher. However, when a measurement area of the carrier mobility is 9 mm2 or more, the high carrier mobility of 8000 cm2/V·sec or more is measured only in the case of the thickness in a range of less than 9.6 µm and 20 nm or more of the present invention (second aspect), and it is thought to be difficult to prepare a graphite film having a thickness of 9.6 µm or more or having a thickness of less than 20 nm which has the characteristic of a carrier mobility of 8000 cm2/V·sec or more in measurement of an area of 9 mm2 or more.

The carrier mobility along the a-b plane direction at 25° C. is 8000 cm2/V·sec or more, preferably 9000 cm2/V·sec or more, and more preferably 10000 cm2/V·sec or more using a test piece obtained by cutting out the resulting sheet into a size of 3×3 mm2 as a basis. An upper limit of the carrier mobility is not particularly limited, and for example, it may be 20000 cm2/V·sec or less, or 18000 cm2/V·sec or less. When the carrier mobility is less than 8000 cm2/V·sec or less, the characteristic of current density resistance may be inferior to that of copper.

When the graphite film is used as a wiring material, an area of 3×3 mm2 or more is practically required, and therefore it is important how the carrier mobility would be in the graphite film having a larger area. The carrier mobility was further measured on the test pieces having a larger area (1×1 cm2, 10×1 cm2, 10×10 cm2), but measured values of these test pieces were little different from the measured result at an area of 3×3 mm2. Accordingly, it is found that the method of preparing a graphite film of the present invention (second aspect) is a breakthrough technique as a practical method for preparation of a graphite wiring material. That is, the present invention (second aspect) pertains to a graphite sheet or a graphite wiring material characterized in that the sheet has a thickness in a range of less than 9.6 µm and 20 nm or more, an area of 3×3 mm2 or more, and a carrier mobility along the a-b plane direction at 25° C. of 8000 cm2/V·sec or more. The present invention was made by finding out that use of such a graphite film or graphite wiring material enables to realize the characteristic of current density resistance further exceeding that of copper wiring.

The area of the graphite sheet is not particularly limited as long as a test piece with an area of 3×3 mm2 or more can be cut out, and for example, it may be 1×1 cm2 or more, 2×2 cm2 or more, or 5×5 cm2 or more. An upper limit of the area is not particularly limited, and for example, it may be 50×50 cm2 or less, or 30×30 cm2 or less.

The graphite sheet with high carrier mobility preferably has a dense structure in which defects or voids are not present in the sheet. When defects or voids enter the graphite sheet, the density of the graphite sheet is lowered, and the thermal conductivity, the carrier mobility and the current density resistance tend to decrease. From this, the density of the graphite sheet is preferably high. Specifically, the density is preferably 2.0 g/cm3 or more, more preferably 2.1 g/cm3 or more, and most preferably 2.15 g/cm3 or more. Densities of graphite films having a thicknesses in a range of 10 µm to 20 nm were measured, and consequently, all of densities of graphite films having a thicknesses in a range of 10 µm to 500 nm were 2.0 g/cm3 or more. An upper limit of the density is, for example, 2.26 g/cm3 or less. However, a density of a film having a thickness of 500 nm or less is unmeasurable due to a problem of measuring technique under the current measuring technique.

<Measurement of Characteristic of Current Density Resistance>

Measurement of the characteristic of current density resistance is carried out by using a test piece of a specific shape (standard test piece has a line width of 2 mm and a length of 10 mm) cut into a strip shape, applying a constant DC current to the test piece, and measuring a voltage value at this time. Further, for comparison, the same measurement may be carried out using the same shaped copper foil. The measurement is carried out in an atmosphere of 250° C. in a nitrogen gas or an argon gas, and a current density in the below-mentioned case is taken as a characteristic of current density resistance. The above-mentioned case is where there is no changes between a voltage value after a lapse of five minutes at which the test piece is thought to reach a constant temperature after applying a current and a voltage value at the time of further applying a current for 60 minutes. When an abnormal matter such as evaporation or damage of the test piece occurs due to heat generation to increase a resistance value, a value of measured voltage increases, and when a wiring is broken completely, voltage measurement cannot be performed. Therefore, the characteristic of current density resistance can be estimated by observing changes in voltage value.

The characteristic of current density resistance of a copper foil was measured by us, and consequently the characteristic of current density resistance was nearly 2×106 A/cm2 in the copper foil having a cross-section of 0.02 mm2 (copper foil thickness 10 µm, electrode width 2 mm) or less. The characteristic of current density resistance was 1×106 A/cm2 in the copper foil having a cross-section of 0.001 mm2 (copper foil thickness 1 µm, electrode width 1 mm) or less.

Similarly, the characteristic of current density resistance of the graphite thin film prepared by the method of the present invention (second aspect) was measured. As a result of this, it was found that the characteristic of current density resistance corresponds to the carrier mobility measurement (the value measured at an area of 1 cm2 or more) of the graphite thin film well. That is, when 2×106 A/cm2 which is a measured value of the characteristic of current density resistance in the copper foil is take as a reference value, it was found that in the case of the graphite film having a characteristic in which the carrier mobility is 8000 cm2/V sec or more, the graphite film has a characteristic of current density resistance nearly equal to the reference value; in the case of the graphite film having a carrier mobility of 9000 cm2/V sec or more, the graphite film has a characteristic of current density resistance of about 4×106 A/cm2; and in the case of the graphite film having a carrier mobility of 10000 cm2/V·sec or more, the graphite film has a characteristic of a current density resistance of about 8×106 A/cm2.

In the graphite sheet of the present invention (second aspect), the characteristic of current density resistance is preferably 2×106 A/cm2 or more, more preferably 4×106 A/cm2 or more, and moreover preferably 8×106 A/cm2 or more. An upper limit of the characteristic of current density resistance is not particularly limited as long as it exhibits a higher characteristic of current density resistance than that of copper. That is, in order to realize the characteristic of current density resistance higher than that of copper in the graphite wiring material of the present invention (second aspect), the characteristic of carrier mobility is preferably 8000 cm2/V·sec or more, more preferably 9000 cm2/V·sec or more, and most preferably 10000 cm2/V·sec or more.

In the graphite sheet of the present invention (second aspect), a thermal conductivity along the a-b plane direction at 25° C. is preferably 1800 W/mK or more, more preferably 1900 W/mK or more, furthermore preferably 1950 W/mK or more, moreover preferably 2000 W/mK or more, and most preferably 2050 W/mK or more. The thermal conductivity may be, for example, 3000 W/mK or less, or may be 2500 W/mK or less. The thermal conductivity can be measured by a cyclic heating method using a square-shaped test piece having an area of 1×1 cm2 or more cut out from the resulting graphite sheet.

<Lamination of Graphite Film>

Since resistance to a current magnitude in an electric wiring line is proportional to a cross-section area, in the case of the graphite wiring material of the present invention (second aspect), it is a disadvantageous condition as a large current wiring material that an upper limit of a thickness of the graphite film is 9.6 µm. However, since it is possible to prepare a graphite film having larger thickness by laminating the graphite films, this technique may be employed when the graphite wiring material of the present invention (second aspect) is used for uses such as power electronics or the like. In order to laminate a plurality of graphite films, these graphite films may be hot pressed under a pressure of 100 gf or more applied in a temperature region of 2500° C. or higher (Non-Patent Document 14).

A magnitude of the carrier mobility required for formation of a high-frequency circuit having a characteristic which exceeds that of the copper wiring has only to be 16 cm2/V·sec of copper or more in principle. As previously described, since the graphite film of the present invention (second aspect) has the characteristic of a carrier mobility of 8000 cm2/V·sec or more, it is found that it has an extremely excellent characteristic as the wiring material for a fine wiring circuit. For such a graphite wiring material for a high-frequency circuit, the carrier mobility is preferably 8000 cm2/V·sec or more, more preferably 9000 cm2/V·sec or more, and most preferably 10000 cm2/V·sec or more.

<Compounding with Insulating Substrate>

In order to use the graphite sheet of the present invention (second aspect) as an electric wiring circuit, compounding with an insulating substrate (laminated board for wiring) may be performed. In the laminated board for wiring of the present invention (second aspect), the graphite sheet is characterized by being laminated on the insulating organic polymer film or the insulating inorganic substrate. The insulating substrate is an essential substrate at the time when the graphite wiring material is used as an electric circuit, and it is not only important for imparting insulation properties, but also necessary for mechanically holding an extremely thin graphite film circuit of the present invention (second aspect).

Such compounding of a substrate and graphite may be performed with use of an adhesive, or a compound may be prepared by a physical means such as thermocompression bonding, as required. The insulating substrate is not particularly limited, and organic polymer films such as a heat-resistant polyimide substrate, a PEN substrate and a glassepoxy substrate; and inorganic substrates such as a glass substrate, a ceramic substrate, and a metal substrate, which are widely used as an insulating substrate of a printed-wiring board, can be preferably used. Specific examples of the heat-resistant polyimide substrate include a trade name "Apical (registered trademark)" (manufactured by KANEKA CORPORATION), a trade name "Kapton (registered trademark)" (manufactured by DU PONT-TORAY CO., LTD.), and a trade name "Upilex (registered trademark)" (manufactured by Ube Industries, Ltd.). Further, when the graphite sheet is used as a fine circuit within a semiconductor such as CPU, it may be formed on a silicon substrate or a SiO2 layer.

A polyimide resin (thermoplastic polymer) can be effectively used not only for serving as a substrate, but also for thermocompression bonding for adhesion. The polyimide for thermocompression bonding is preferably a polyimide having a glass transition point of 500° C. or lower, and various substrate materials used for production of usual copper wiring printed boards or a polyimide for thermocompression bonding can be effectively used for compounding of the present invention (second aspect). In addition to this, a modified acrylic adhesive sheet (Pyralux (registered trademark) LF0100 manufactured by DuPont Co.) or the like can also be used as a thermoplastic polymer. As described above, the above-mentioned graphite sheet may be bonded to the insulating organic polymer film or the insulating inorganic substrate with a thermoplastic polymer.

<Production Method of Wiring Circuit (Wiring Board)>

A production method of a wiring board of the present invention (second aspect) may have the following steps of;

(A) unifying the graphite sheet on the insulating organic polymer film or the insulating inorganic substrate;

(B) forming wiring or a hole on the surface of the unified graphite sheet; and (C) forming metal plating on the wiring or hole as required.

Hereinafter, the steps will be described specifically.

(Step (A))

The insulating organic polymer film or the insulating inorganic substrate is not particularly limited, and the above-mentioned materials can be used. The organic polymer film or the inorganic substrate may be used singly, may be used in combination, or may be used in the form of being previously unified as long as these have flexibility.

The organic polymer film or the inorganic substrate may be provided with an adhesive layer to adhere a graphite sheet, and examples of the adhesive layer include the above-mentioned adhesive layers.

Examples of a method for laminating the organic polymer film, the inorganic substrate, the graphite sheet and the adhesive layer include various thermocompression bonding methods such as hot pressing, vacuum pressing, laminating (heat laminating), vacuum laminating, hot-roll laminating and vacuum hot-roll laminating.

For these unifying methods, optimum temperature, pressure and treatment time can be employed.

(Step (B))

In order to form wiring or a hole (e.g., via hole) on the surface of the unified graphite sheet, a drill such as NC (numerical control) drill, punching such as NC punching, plasma such as plasma using oxygen or argon, or lasers such as a solid-state laser, a liquid laser and a gas laser can be used.

Particularly, as a laser, publicly known lasers for processing, such as a carbon dioxide laser, a YAG laser, a YVO4 laser, a fiber laser and an excimer laser, are preferred, and the YAG laser and the YVO4 laser are particularly preferred.

(Step (C))

The wiring or the hole formed on the surface of the graphite sheet may be additionally provided with a conductor such as a metal plating layer.

Any of various types of dry plating such as vapor deposition, sputtering and CVD and various types of wet plating such as non-electrolytic plating can be applied to formation of the metal plating layer. Examples of the types of the non-electrolytic plating include non-electrolytic copper plating, non-electrolytic nickel plating, non-electrolytic gold plating, non-electrolytic silver plating and non-electrolytic tin plating. A thickness of the metal plating layer is not particularly limited.

The steps (A) to (C) have been described above. In addition to this, the steps of electrolytic plating in which a metal layer is formed up to a desired thickness, plating resist, etching, resist peeling and the like may be performed, or these steps may be performed repeatedly.

Further, the graphite wiring material prepared by the steps (A) to (C) may be peeled off from the substrate and laminated on another organic polymer film or inorganic substrate to prepare a wiring board.

In the above method, the graphite wiring material can be formed by etching of a laser. That is, the graphite wiring material is formed by partially removing the above-mentioned graphite sheet. Since the graphite wiring material of the present invention (second aspect) has a thickness of less than 9.6 µm and 20 nm or more and is extremely thin, it is largely characterized in that a circuit can be formed without damaging an insulating organic substrate or the like by laser-etching. Since graphite is composed of only carbon, it is basically easily burnt by heat of a laser to form a carbon dioxide gas, and hence the graphite can be easily etched (removed) by a publicly known laser for processing such as a YAG laser, a YVO4 laser, a fiber laser or an excimer laser. Therefore, when a graphite film alone is processed, even a graphite sheet having a thickness of 9.6 µm or more can be adequately processed.

On the other hand, when processing is carried out with the graphite film bonded to the insulating substrate, if a thickness of the graphite film is 9.6 µm or more and the insulating substrate is an organic substrate, the organic substrate is burnt and carbonized due to heat in laser-etching to be damaged, and therefore it is difficult to form a wiring circuit. However, in the case of the graphite sheet having a thickness in a range of the present invention (second aspect), only the graphite layer can be etched away without damaging the organic substrate at all by setting optimum laser-irradiation conditions (intensity, irradiation time, etc.) since a layer thickness is very small and the graphite layer can be easily etched away, and since a thermal conductivity in a graphite thickness direction is relatively low with respect to a thermal conductivity in a plane direction. Such processing cannot be realized in the graphite film having a thickness of 9.6 µm or more, and the graphite wiring material of the present invention (second aspect) is largely characterized by such processing.

Further, particularly when the substrate is bonded to the graphite film through thermocompression bonding, the adhesive layer is melted and absorbs heat in a laser-etching step, and therefore only the graphite layer can be etched away with little damage to the substrate.

In the graphite wiring material of the present invention (second aspect), a width of the wiring is preferably 2 mm or less, more preferably 1.5 mm or less, furthermore preferably 1.0 mm or less, and moreover preferably 0.5 mm or less from the viewpoint of the current density resistance higher than that of copper, and a lower limit of the width of the wiring is not particularly limited as long as the wiring exhibits current density resistance higher than that of copper, and it may be, for example, 8 nm or more, or may be about 5 nm or more.

When the graphite wiring material of the present invention (second aspect) satisfies the above-mentioned thickness and line width, a cross-section area in a direction perpendicular to the a-b plane is preferably $1.92 \times 10^{-2}$ mm2 or less, more preferably $1.0 \times 10^{-2}$ mm2 or less, and moreover preferably $5 \times 10^{-3}$ mm2 or less. A lower limit of the cross-section area is not particularly limited, and for example, it may be $1.6 \times 10^{-4}$ μm2 or more, and may be about $1 \times 10^{-4}$ μm2 or more. When the cross-section area is in the above range, the graphite wiring material exhibits a characteristic of current density resistance higher than that of copper.

The above-mentioned graphite wiring material may be laminated on the insulating organic polymer film or the insulating inorganic substrate. Further, the graphite wiring material may be bonded to the insulating organic polymer film or the insulating inorganic substrate with the thermoplastic polymer.

(First Aspect and Second Aspect)

The present application claims for priority of Japanese Patent Application No. 2013-199329 filed on Sep. 26, 2013, Japanese Patent Application No. 2014-028648 filed on Feb. 18, 2014, and Japanese Patent Application No. 2014-049427 filed on Mar. 12, 2014. The entire contents of specifications of Japanese Patent Application No. 2013-199329 filed on Sep. 26, 2013, Japanese Patent Application No. 2014-028648 filed on Feb. 18, 2014, and Japanese Patent Application No. 2014-049427 filed on Mar. 12, 2014 are incorporated by reference.

EXAMPLES (First Aspect)

Hereinafter, examples related to the first aspect will be shown, and embodiments of the present invention (first aspect) will be described in more detail. Naturally, the present invention (first aspect) is not limited to these examples, and needless to say, various embodiments are possible with respect to details.

(Method for Evaluation of Physical Properties)

<Film Thickness>

Thicknesses of the polymer film serving as a raw material and the graphite sheet have a margin of error of plus or minus about 5 to 10%. Therefore, ten-point average thickness of the resulting film or sheet is defined as a test piece thickness in the present invention (first aspect).

<Average Crystal Grain Size>

An average crystal grain size of graphite referred to in the present invention (first aspect) was calculated by the following method utilizing an electron backscatter diffraction image method (EBSD). That is, the average crystal grain size was measured by irradiating a graphite sheet set in a lens tube of a scanning electron microscope (SEM) with electron beams. When the difference in angle between neighboring measuring points is 16 degrees or less at this time, a continuous region is considered as one crystal grain, and when the difference in angle is 16 degrees or more, a continuous region is considered as a grain boundary, and crystal orientation analysis of graphite was carried out. An average grain size was calculated from a crystal orientation map and a crystal size map thus obtained. A specific measurement technique is as follows.

A graphite sheet was fixed to a seat of the SEM with a carbon tape, and then put in a lens tube of the scanning electron microscope (SEM), and a pressure was reduced to 20 Pa or less, and the graphite sheet was irradiated with electron beams such that an angle between a horizontal axis of the SEM and a detector of EBSD was 70 degrees. An area of 300×600 μm on the graphite sheet was divided into 60000 points and measurement was carried out. In this case, the difference in angle between neighboring measurement points was 16 degrees or less, the region was considered as one crystal grain, and when the difference in angle was 16 degrees or more, the region was considered as another grain boundary, and crystal orientation mapping analysis of graphite was carried out. From the resulting crystal orientation mapping analysis result and the resulting crystal size map, an average grain size was calculated by using an analysis software supplied with an EBSD apparatus (manufactured by TSL SOLUTIONS LTD.). Here, the average crystal grain size means an average value determined by processing, by an Area Fraction method, a crystal grain size determined by multiplying the number of pixels included in a crystal grain by a pixel area (unit area), and the average crystal grain size is automatically calculated by the above-mentioned analysis software.

<Density>

A volume of the graphite sheet was measured with a helium gas displacement pycnometry system [AccuPyc II 1340 manufactured by SHIMADZU CORPORATION], a mass was separately measured, and a density of the graphite prepared was calculated from the formula Density (g/cm3)=Mass (g)/Vol (cm3). In this method, however, it was impossible to measure a density of a graphite sheet having a thickness of 200 nm or less because of an excessively large margin of error. Therefore, when a thermal conductivity was calculated from a thermal diffusion factor of the graphite sheet having a thickness of 200 nm or less, the calculation was performed on the assumption that the density of the graphite sheet was 2.1.

<Thermal Conductivity>

The thermal diffusion factor of a graphite sheet was measured at a frequency of 10 Hz at 20° C. in a vacuum (about $10^{-2}$ Pa) using a thermal diffusivity measuring apparatus ("LaserPit" manufactured by ULVAC Technologies, Inc.) based on a periodic heating method. This is a method in which a thermocouple is attached to a point with a certain distance from a laser-heated point, and a change in temperature of the point is measured. Herein, the thermal conductivity (W/mK) was calculated by multiplying a thermal diffusion factor (m2/s) by a density (kg/m3) and a specific heat (798 kJ/(kg·K)). In this apparatus, the thermal diffusion factor was measurable when the thickness of the graphite sheet was 1 μm or more and the area was 25 mm2 or more. However, when the thickness of the graphite sheet was 1 μm or less or when the area of the graphite sheet was 25 mm2 or less, the thermal diffusion factor could not be measured exactly because of a too large measurement margin of error.

Then, the thermal diffusion factor was measured using a periodic heating radiation thermometry method (Thermowave Analyzer TA3 manufactured by BETHEL Co., Ltd.) as the second measurement method. This is an apparatus in which periodic heating is carried out by a laser and a temperature is measured with a radiation thermometer. Since this apparatus is perfectly non-contact with the graphite sheet at the time of measurement, even the test piece in which the thickness of the graphite sheet is 1 μm or less and the area is 25 mm2 or less can be measured. In order to check the reliability of measured values of both apparatuses, some test pieces were measured with both apparatuses, and it was confirmed that consequently both numeric values were agreed with each other.

In the apparatus of BETHEL Co., Ltd., the frequency of periodic heating can be varied in a rage of up to 800 Hz. That is, this apparatus is characterized in that temperature measurement which is commonly performed in a contact mode with a thermocouple is performed with a radiation thermometer, and a measurement frequency is variable. Even when the frequency is varied, a constant thermal diffusion factor is to be measured in principle, and therefore measurement was performed varying the frequency in this apparatus. When the test piece having a thickness of 1 μm or less, or the test piece having the area of the graphite sheet of 25 mm2 or less was measured, measured values often varied in measurement at a frequency of 10 Hz or 20 Hz but were almost constant in measurement at a frequency of 70 Hz to 800 Hz. Then, a numeric value exhibiting a constant value irrespective of the frequency (value at a frequency of 70 Hz to 800 Hz) was employed and taken as a thermal diffusion factor.

Hereinafter, the present invention (first aspect) will be described in more detail by way of examples.

Production Example A-1

Into 100 g of a 18% by mass DMF solution of polyamic acid synthesized from pyromellitic anhydride and 4,4'-diaminodiphenyl ether in the mole ratio of 1:1, a curing agent composed of 20 g of acetic anhydride and 10 g of isoquinoline were mixed, and the resulting mixture was stirred, defoamed by centrifugal separation, and then applied by casting onto an aluminum foil. Operations from stirring to defoaming were performed while the mixture was cooled to 0° C. A laminate of the aluminum foil and the polyamic acid solution was heated at 120° C. for 150 seconds, at 300° C. for 30 seconds, at 400° C. for 30 seconds, and at 500° C. for 30 seconds, and then the aluminum foil was removed to prepare a polyimide film (polymer test piece A). Further, pyromellitic anhydride and p-phenylenediamine were used as raw materials, and a polyimide film (polymer test piece B) was prepared in the same manner as in the test piece A, and 3,3',4,4'-biphenyltetracarboxylic dianhydride and p-phenylenediamine were used as raw materials, and a polyimide film (polymer test piece C) was prepared in the same manner as in the test piece A. With respect to the thickness of the polyimide films, several types of films having different thicknesses in a range of 50 μm to 50 nm were prepared by adjusting a casting speed or the like.

Examples A-1 to A-8

Using an electric furnace, each of eight types of polyimide films prepared in Production Example A-1 (polymer test piece A: area 400 mm2), which have thicknesses in a range of 18 μm to 100 nm, was heated to 1000° C. at a rate of 10° C./min in a nitrogen gas, and maintained at 1000° C. for 1 hour to be pretreated. Then, the resulting carbonized sheet was set at the inside of a cylindrical graphite heater and heated to a treatment temperature of 3000° C. (maximum temperature) at a temperature raising rate of 20° C./min. The sheet was maintained at this temperature for 30 minutes (treatment time), and thereafter the temperature was lowered at a rate of 40° C./min to prepare a graphite sheet. The treatment was performed under a pressure of 0.15 MPa in an argon atmosphere.

Although areas of the resulting graphite sheets were not constant since a rate of shrinkage or expansion varies depending on the difference of thickness, all of the graphite sheets had an area in a range of 169 mm2 to 361 mm2. A TEM photograph of a cross-section of the graphite sheet obtained in Example A-3 is shown in FIG. A-3. As shown in this photograph, the inside of the graphite sheet has a layer structure extremely neatly oriented, and even in the observation of a broad area, the existence of a large domain structure which is seen in HOPG was not found.

Values of a thickness (μm), an average crystal grain size (μm), a density (g/cm3) and a thermal conductivity (W/mK) of each of the resulting graphite sheets are shown in Table A-1. It was found that all test pieces of films having a thickness shown in this table exhibit an excellent thermal conductivity of 1950 W/mK or more by a heat treatment at 3000° C. for 30 minutes.

TABLE A-1

| Example | Maximum Temperature (° C.) | Test Piece | Thickness (μm) | Average Crystal Grain Size (μm) | Density (g/cm$^3$) | Thermal Conductivity (W/mK) |
|---|---|---|---|---|---|---|
| A-1 | 3000 | A | 9.6 | 1.9 | 2.05 | 1960 |
| A-2 | 3000 | A | 4.7 | 2.0 | 2.07 | 2040 |
| A-3 | 3000 | A | 2.1 | 2.5 | 2.11 | 2080 |
| A-4 | 3000 | A | 1.2 | 3.2 | 2.22 | 2100 |
| A-5 | 3000 | A | 0.72 | 3.3 | 2.23 | 2080 |
| A-6 | 3000 | A | 0.31 | 3.0 | 2.20 | 2120 |
| A-7 | 3000 | A | 0.14 | 2.8 | — | 2120 |
| A-8 | 3000 | A | 0.06 | 2.5 | — | 1990 |

Examples A-9 to A-12

The polymer test piece A used in Examples A-3 and A-4 was used, and the same treatment as in Examples A-3 and A-4 was performed except for changing the maximum treatment temperature to 3100° C. or 3200° C., and a thickness (μm), a density (g/cm3) and a thermal conductivity (W/mK) of each of the resulting graphite sheets were measured. The results of measurement are shown in Table A-2. Value of the thermal conductivity further increased, and the average crystal grain size became larger. It was found from this that the heat treatment at 3100° C. or at 3200° C. was extremely effective for attaining a highly thermal conductive graphite sheet.

TABLE A-2

| Example | Maximum Temperature (° C.) | Test Piece | Thickness (μm) | Average Crystal Grain Size (μm) | Density (g/cm$^3$) | Thermal Conductivity (W/mK) |
|---|---|---|---|---|---|---|
| A-9 | 3100 | A | 2.1 | 2.6 | 2.12 | 2150 |
| A-10 | 3200 | A | 2.0 | 3.7 | 2.16 | 2230 |
| A-11 | 3100 | A | 1.2 | 3.6 | 2.26 | 2180 |
| A-12 | 3200 | A | 1.1 | 4.5 | 2.25 | 2260 |

Comparative Examples A-1 to A-4

Using an electric furnace, the polymer test pieces A used in Example A-4 were heated to 1000° C. at a rate of 10°

C./min in a nitrogen gas, and maintained at 1000° C. for 1 hour to be pretreated. Then, the resulting carbonized sheets were set at the inside of a cylindrical graphite heater and heated to 2800° C. or 2900° C., respectively, at a temperature raising rate of 20° C./min. The sheets were maintained at this temperature for 30 minutes or for 2 hours, respectively, and thereafter these temperatures were lowered at a rate of 40° C./min to prepare a graphite sheet. The treatment was performed under a pressure of 0.15 MPa in an argon atmosphere. The obtained results are shown in Table A-3. With a heat treatment at 2800° C. or 2900° C., the thermal conductivity of 1950 W/mK or more could not be realized even though the treatment time was 30 minutes or 2 hours. From this, it was concluded that a temperature of 3000° C. or higher is required for realizing a high thermal conductivity of the present invention (first aspect).

TABLE A-3

| Comparative Example | Test Piece | Thickness (µm) | Maximum Temperature (° C.) | Treatment Time (minutes) | Average Crystal Grain Size (µm) | Thermal Conductivity (W/mK) |
|---|---|---|---|---|---|---|
| A-1 | A | 1.3 | 2800 | 30 | 0.8 | 1760 |
| A-2 | A | 1.2 | 2800 | 120 | 1.1 | 1850 |
| A-3 | A | 1.2 | 2900 | 30 | 0.8 | 1800 |
| A-4 | A | 1.2 | 2900 | 120 | 1.4 | 1880 |

Comparative Examples A-5 to A-8

The polyimide films (polymer test pieces A) having a thickness of 25 µm and having a thickness of 50 µm were used, and carbonized and graphitized under the same conditions as in Examples A-9 to A-12. The thicknesses of the resulting graphite sheets were 12 µm and 28 µm in the treatment at 3100° C., and 11 µm and 26 µm in the treatment at 3200° C., respectively. The obtained results are shown in Table A-4. It is found that it becomes extremely difficult to realize a high thermal conductivity exceeding 1950 W/mK of the present invention (first aspect) as a thickness of the graphite sheet is increased. The reason for this is probably that when a polymer film is graphitized, since the reaction of graphitization proceeds from the film surface, it is difficult to convert the entire film to graphite of high quality in the case of a film having a large thickness. From this, it was concluded that the thickness of the graphite sheet is preferably 9.6 µm or less for realizing a high thermal conductivity of the present invention (first aspect).

TABLE A-4

| Comparative Example | Maximum Temperature (° C.) | Treatment Time (minutes) | Test Piece | Thickness (µm) | Thermal Conductivity (W/mK) |
|---|---|---|---|---|---|
| A-5 | 3100 | 30 | A | 12 | 1700 |
| A-6 | 3200 | 30 | A | 11 | 1850 |
| A-7 | 3100 | 30 | A | 28 | 1600 |
| A-8 | 3200 | 30 | A | 26 | 1700 |

Comparative Examples A-9 to A-14

The polyimide films (polymer test pieces A) having a thickness of 80 nm and having a thickness of 50 nm were used, and carbonized and graphitized under the same conditions as in Examples A-1 to A-12. The thicknesses of the resulting graphite sheets were 50 nm and 32 nm in the treatment at 3000° C., 45 nm and 30 nm in the treatment at 3100° C., and 40 nm and 27 nm in the treatment at 3200° C., respectively. The obtained results are shown in Table A-5. It became extremely difficult to realize a high thermal conductivity exceeding 1950 W/mK of the present invention (first aspect) when a thickness of the graphite was decreased to 50 nm or less. The reason for this is not clear; however, it was concluded that the thickness of the graphite sheet is preferably more than 50 nm for realizing a high thermal conductivity of the present invention (first aspect).

TABLE A-5

| Comparative Example | Maximum Temperature (° C.) | Treatment Time (minutes) | Test Piece | Thickness (nm) | Thermal Conductivity (W/mK) |
|---|---|---|---|---|---|
| A-9 | 3000 | 30 | A | 50 | 1850 |
| A-10 | 3100 | 30 | A | 45 | 1740 |
| A-11 | 3200 | 30 | A | 40 | 1600 |
| A-12 | 3000 | 30 | A | 32 | 1600 |
| A-13 | 3100 | 30 | A | 30 | 1500 |
| A-14 | 3200 | 30 | A | 27 | 1400 |

Examples A-13 to A-18

Several test pieces having different thicknesses were graphitized in the same manner as in Examples A-1 to A-8 except for using the polymer test piece B and the polymer test piece C. A thickness (µm), a density (g/cm3) and a thermal conductivity (W/mK) of each of the resulting graphite sheets were measured, and the results of measurement are shown in Table A-6. It was found that in the films having thicknesses shown in this Table, both of the test piece B and the test piece C exhibit an excellent thermal conductivity of 1950 W/mK or more by a heat treatment at 3000° C. for 30 minutes.

TABLE A-6

| Example | Maximum Temperature (° C.) | Test Piece | Thickness (µm) | Average Crystal Grain Size (µm) | Density (g/cm³) | Thermal Conductivity (W/mK) |
|---|---|---|---|---|---|---|
| A-13 | 3000 | B | 4.3 | 2.4 | 2.15 | 2020 |
| A-14 | 3000 | B | 2.6 | 3.3 | 2.20 | 2100 |
| A-15 | 3000 | B | 0.6 | 3.3 | 2.20 | 1980 |
| A-16 | 3000 | C | 3.4 | 3.0 | 2.20 | 2040 |
| A-17 | 3000 | C | 2.1 | 2.6 | 2.10 | 2000 |
| A-18 | 3000 | C | 0.5 | 3.1 | 2.18 | 1980 |

Examples A-19 to A-22

Comparative Examples A-15 to A-18

The test piece (polymer test piece A, maximum treatment temperature 3200° C., area 324 mm2) used in Example A-10 was cut into smaller-sized square or rectangular test pieces, and the thermal conductivity of each test piece was measured. Measurement results are shown in Table A-7 (Examples A-19 to A-22) and Table A-8 (Comparative Examples A-15 to A-18). Test pieces of Examples A-19 to A-21 and Comparative Examples A-15 and A-18 are square-shaped and test piece of Example A-22 and Comparative Examples A-16 and A-17 are rectangle-shaped. The results of Table A-7 and Table A-8 show that the smaller the test piece area becomes, the lower the thermal conductivity of the test piece becomes, and the thermal conductivity is reduced to 2000 W/mK when the area becomes 4 mm2 (square), and reduced to 1950 W/mK when the area becomes 4 mm2 (rectangle).

TABLE A-7

| Example | Test Piece | Area (mm$^2$) | Thermal Conductivity (W/mK) |
|---|---|---|---|
| A-10 | A | 324 | 2230 |
| A-19 | A | 81 | 2150 |
| A-20 | A | 16 | 2100 |
| A-21 | A | 4 | 2000 |
| A-22 | A | 4 | 1950 |

TABLE A-8

| Comparative Example | Test Piece | Area (mm$^2$) | Thermal Conductivity (W/mK) |
|---|---|---|---|
| A-15 | A | 2.25 | 1700 |
| A-16 | A | 3 | 1780 |
| A-17 | A | 2 | 1600 |
| A-18 | A | 1 | 1480 |

Moreover, as shown in Comparative Examples A-15 to A-18, the test piece area was varied to 2.25 mm2 (square), 3 mm2 (rectangle), 2 mm2 (rectangle), and 1 mm2 (square), but in any case, the thermal conductivity of the test piece was less than 1950 W/mK, and a thermal conductivity of 1950 W/mK or more could not be realized. That is, this result indicates that in the highly thermal conductive graphite of the present invention (first aspect), an area of the graphite is preferably set to 4 mm2 or more in order to realize a high thermal conductivity of 1950 W/mK or more.

From descriptions described above, it is found that it is important to set a thickness of a graphite sheet to 9.6 μm or less and more than 50 nm, an area of the sheet to 4 mm2 or more, and a temperature of a heating treatment to 3000° C. or higher in order to prepare a graphite sheet having a high thermal conductivity according to the present invention (first aspect). That is, the present invention (first aspect) was made by finding out that when the conditions are satisfied as described above, it is possible to realize a thermal conductivity exceeding 1950 W/mK which is a thermal conductivity having been said to be a limit value of conventional graphite.

(Second Aspect)

Next, examples related to the second aspect will be shown below, and embodiments of the present invention (second aspect) will be described in more detail. Naturally, the present invention (second aspect) is not limited to these examples, and various embodiments are possible with respect to details.

(Method for Measurement of Physical Properties)

<Film Thickness>

Thicknesses of the organic polymer sheet serving as a raw material and the graphite sheet, had a problem of measurement accuracy and a margin of error of plus or minus about 5% depending on a measurement location of the film (sheet). Therefore, ten-point average thickness of the resulting sheet is defined as a test piece thickness in the present invention (second aspect).

<Density>

A volume of the graphite sheet was measured with a helium gas displacement pycnometry system [AccuPyc II 1340 manufactured by SHIMADZU CORPORATION], a mass was separately measured, and a density of the graphite sheet prepared was calculated from the formula Density (g/cm3)=Mass (g)/Vol (cm3). However, a graphite sheet which can be measured by this method is a test piece having a thickness of 500 nm or more, and it was impossible, because of an excessively large margin of error, to measure a density of a graphite sheet having a thickness of less than 500 nm by this technique.

<Measurement of Electrical Conductivity, Carrier Mobility and Carrier Concentration>

The electrical conductivity of the graphite sheet was measured by a Van der Pauw method. This method is a method most suitable for measuring the electrical conductivity of a thin film-like test piece. Details of this measurement method are described in Non-Patent Document 12 (P170). This method is characterized in that electrodes can be provided at arbitrary four points at an end portion of a thin film test piece having an arbitrary shape and measurement can be performed, and when a thickness of a test piece is uniform, exact measurement can be performed. In the present invention (second aspect), measurement was performed by using a test piece cut into a square shape, and attaching a silver paste electrode to each of four corners (edges) of the test piece. Measurement was carried out with use of Resistivity/DC&AC Hall measurement system, ResiTest 8300 manufactured by TOYO Corporation.

Measurement of the carrier mobility and the carrier concentration was performed by applying a magnetic field to the test piece used in the above-mentioned measurement of electrical conductivity by a Van der Pauw method, and measuring a Hall coefficient of the test piece. In a calculation in the case where the same number of electrons and holes are present like graphite, it is necessary to make analysis using a Newton method (Non-Patent Document 13). The point of this calculation is that assumption is necessary since there are four parameters of densities of the electron and the hole and mobilities of the electron and the hole in total, and three simultaneous equations are held from three types of measurements of electrical conductivity, Hall coefficient and magnetic resistance. Assumption that in graphite, the mobility (or density) of electrons and the mobility (or density) of holes are the same was used. Since it is known that in the graphite of high quality, the numbers of electrons and holes are actually almost the same (Non-Patent Document 7), this assumption is of no problem. In our calculation, a numerical calculation was carried out with a program using the above assumption according to the technique of Non-Patent Document 13 to determine a carrier density and carrier mobility.

<Characteristic of Current Density Resistance>

The prepared graphite sheet was cut into a piece of 2 mm wide and 20 mm long, the piece was clamped at its both ends with a graphite block electrodes with a distance between electrodes being 10 mm, and a DC current was applied to measure the characteristic of current density resistance. The measurement of the characteristic was performed in an environment of an inert gas (argon or nitrogen) and 250° C. For comparison, copper foils having thicknesses in a range of 10 μm to 1 μm were prepared, and the characteristics of current density resistance of copper foils cut into the same shape were measured to compare with the graphite test pieces. When the value of current density resistance of a graphite sheet exceeded that of copper, the characteristic of current density resistance of the graphite sheet was assumed to be beyond copper. The characteristic of current density resistance of the copper foils having thicknesses in a range of 10 μm to 1 μm was about 1×106 to 2×106 A/cm2 (in the case of a line width of 2 mm). Incidentally, in the case where a current of 20 A is applied to a test piece of 2 mm wide and 1 μm thick, if a voltage value does not change after 60 minutes, this means that the current density resistance of the test piece is $1\times10^6$ A/cm$^2$.

Production Example B-1 of Polymer Film as Raw Material

Into 100 g of a 18% by mass DMF solution of polyamic acid synthesized from pyromellitic anhydride and 4,4'-diaminodiphenyl ether in the mole ratio of 1:1, a curing agent composed of 20 g of acetic anhydride and 10 g of isoquinoline were mixed, and the resulting mixture was stirred, defoamed by centrifugal separation, and then applied by casting onto an aluminum foil, and a thickness of the applied mixture was adjusted with a wire bar. In this manner, films having different thicknesses in a range of 50 μm to 1 μm were prepared. Since polymer films having uniform thicknesses in a range of 1 μm to 20 nm are hard to be prepared in this manner, several types of films having different thicknesses were prepared by using a spin coater and varying a concentration of the amide acid solution and a rotational speed of the spin coater. In addition, in examples of the present invention (second aspect), a film is formed without adding a filler component at all at the time of film formation unless otherwise specified, and the content of the filler component, is substantially 0.1% by mass or less.

Operations from stirring to defoaming were performed while the mixture was cooled to 0° C. A laminate of the aluminum foil and the polyamic acid solution was heated at 120° C. for 150 seconds, at 300° C. for 30 seconds, at 400° C. for 30 seconds, and at 500° C. for 30 seconds, and then the aluminum foil was removed to prepare a polyimide film (polymer test piece A). Further, pyromellitic anhydride and p-phenylenediamine were used as raw materials, and a polyimide film (polymer test piece B) was prepared in the same manner as in the test piece A, and 3,3',4,4'-biphenyltetracarboxylic dianhydride and p-phenylenediamine were used as raw materials, and a polyimide film (polymer test piece C) was prepared in the same manner as in the test piece A. In this manner, several types of films having different thicknesses in a range of 50 μm to 20 nm were prepared.

Examples B-1 to B-8

Using an electric furnace, each of eight types of polyimide films prepared in Production Example B-1 (polymer test piece A: area 10×10 cm2) which have different thicknesses, was heated to 1000° C. at a rate of 10° C./min in a nitrogen gas, and maintained at 1000° C. for 1 hour to be pretreated. Then, the resulting carbonized sheet was set at the inside of a cylindrical graphite heater and heated to a treatment temperature of 3000° C. (maximum temperature) at a temperature raising rate of 20° C./min. The sheet was maintained at this temperature for 30 minutes (treatment time), and thereafter the temperature was lowered at a rate of 40° C./min to prepare a graphite sheet. The treatment was performed under a pressure of 0.10 MPa (1.0 kg/cm2) in an argon atmosphere. Although areas of the resulting graphite sheets were not constant since a rate of shrinkage or expansion varies depending on the difference of thickness, all of the graphite sheets had an area in a range of 6.5×6.5 cm2 to 9.5×9.5 cm2. A SEM photograph of a cross-section of the graphite sheet obtained in Example B-4 is shown in FIG. B-5. As shown in this photograph, the inside of the graphite sheet has a layer structure extremely neatly oriented. In addition, all of values of the carrier mobility shown in Examples B-1 to B-8 were obtained by measuring a test piece which was cut into a piece 1 cm square and provided with an electrode attached to an edge.

Further, measurement of the characteristic of current density resistance was performed with use of test pieces cut into a size of 1 mm wide and 20 mm long. Measurement was performed in an environment of argon gas (ordinary pressure). For comparison, the characteristic of current density resistance of a copper film cut into the same shape was measured, and each test piece whose characteristic of current density resistance exceeded that of a copper film having almost the same thickness was rated as "○" and the test piece whose characteristic is lower than or equal to that of a copper film was rated as "×".

A thickness (μm), a thermal conductivity (W/mK), a carrier mobility (cm2/V·sec) and a current density resistance evaluation of each of graphite sheets prepared with thicknesses in a range of 4.7 μm to 40 nm are shown in Table B-1. As is apparent from the results of Table B-1, in these Examples B-1 to B-8, every carrier mobility exhibited a characteristic of 8000 cm2/V·sec or more, and the characteristic of current density resistance was found to be equal to or higher than that of copper (that is, $2\times10^6$ A/cm2 or more).

Examples B-9 to B-11, Comparative Examples B-19, B-20, B-21

The polymer test piece A was used, and the same treatment as in Examples B-1 was performed except for changing the maximum treatment temperature to 3000° C., 3100° C. or 3200° C. with sheets having different thicknesses, and a thickness (μm), a thermal conductivity (W/mK), a carrier mobility (cm2/V·sec) and a current density resistance evaluation of each of the resulting graphite sheets are shown in Table B-1. Although in the test piece (Comparative Examples B-19) having a thickness of 9.6 μm, a value of the carrier mobility was 7200 cm2/V·sec, a characteristic exceeding 8000 cm2/V·sec could be realized by the treatment at 3100° C. or higher (Example B-9: thickness 9.5 μm, and Example B-10: thickness 9.4 μm). It was concluded from this that a thickness of the graphite sheet is preferably less than 9.6 μm for realizing a high carrier mobility of the present invention (second aspect).

On the other hand, in the test pieces having a thickness of 0.02 μm (20 nm), the characteristic exceeding 8000 cm2/V·sec could not be realized by the treatment at 3000° C. or 3100° C. (Comparative Examples B-20 and B-21), but the characteristic exceeding 8000 cm2/V·sec could be realized by the treatment at 3200° C. (Example B-11). In all test pieces in which the characteristic of carrier mobility exceeded 8000 cm2/V·sec, the characteristics of current density resistance exceeded that of copper. From this, it was found that the heat treatments at 3100° C. and at 3200° C. are extremely effective for improving the characteristic of carrier mobility and the characteristic of current density resistance, and by the heat treatments at 3100° C. or at 3200° C., the carrier mobility along the a-b plane direction exceeds 8000 cm2/V·sec to enable to realize the characteristic of current density resistance exceeding that of copper.

Comparative Examples B-1 to B-4

Using an electric furnace, polyimide films (polymer test pieces A) having the same thickness as in the film used in Example B-3 were used as raw materials, and heated to 1000° C. at a rate of 10° C./min in a nitrogen gas, and maintained at 1000° C. for 1 hour to be pretreated. Then, the resulting carbonized sheets were set at the inside of a cylindrical graphite heater and heated to 2800° C. or 2900° C. (maximum treatment temperature), respectively, at a temperature raising rate of 20° C./min. The sheets were maintained at this temperature for 30 minutes or for 120 minutes (2 hours), respectively, and thereafter these temperatures were lowered at a rate of 40° C./min to prepare a graphite sheet. The treatment was performed under a pressure of 0.05 MPa (0.5 kg/cm2) in an argon atmosphere. The obtained results are shown in Table B-2. When heat-treating at 2800° C. or 2900° C., the characteristic of a carrier mobility of 8000 cm2/V·sec or more could not be realized even though the treatment time was 30 minutes or 2 hours. From this, it was concluded that the effect of lengthening a treatment time for realizing the carrier mobility is relatively small, and a temperature of 3000° C. or higher is required in order to realize the carrier mobility of 8000 cm2/V·sec or more. In addition, since Example B-4 had a thickness at which a higher carrier mobility was shown among the results of Examples B-1 to B-8, it was concluded that also in other Examples, a temperature of 3000° C. or higher is required in order to realize the carrier mobility of 8000 cm2/V·sec or more.

Comparative Examples B-5 to B-10

The polyimide films (polymer test pieces A) having a thickness of 25 μm and having a thickness of 50 μm were used, and carbonized and graphitized under the same conditions as in Example B-1 except for employing heat-treating at 3100° C. as the maximum treatment temperature for 30 minutes, at 3200° C. as the maximum treatment temperature for 30 minutes and at 3200° C. as the maximum treatment temperature for 120 minutes. The thicknesses of the resulting graphite sheets were 12 μm (Comparative Example B-5) and 28 μm (Comparative Example B-8) in the treatment at 3100° C., and 11 μm (Comparative Example B-7), 12 μm (Comparative Example B-6), 26 μm (Comparative Example B-10) and 28 μm (Comparative Example B-9) in the treatment at 3200° C., respectively. The obtained results are shown in Table B-2. It is found that it becomes difficult to realize a high carrier mobility exceeding 8000 cm2/V·sec as a thickness of the graphite sheet is increased. From this, it was concluded that the thickness of the graphite sheet is preferably 10 μm or less for realizing high carrier mobility of the present invention (second aspect).

Comparative Examples B-11 to B-14

The polyimide films (polymer test pieces A) having a thickness of 30 nm were used, and carbonized and graphitized under the same conditions as in Example 1 except for employing heat-treating at 3000° C. as the maximum treatment temperature for 30 minutes, at 3100° C. as the maximum treatment temperature for 30 minutes, at 3200° C. as the maximum treatment temperature for 30 minutes and at 3000° C. as the maximum treatment temperature for 120 minutes. The thicknesses of the resulting graphite sheets were 0.017 μm (17 nm) (Comparative Example B-11) in the treatment at 3000° C. for 30 minutes, 0.015 μm (15 nm) (Comparative Example B-12) in the treatment at 3100° C. for 30 minutes, 0.012 μm (12 nm) (Comparative Example B-13) in the treatment at 3200° C. for 30 minutes, and 0.011 μm (11 nm) (Comparative Example B-14) in the treatment at 3000° C. for 120 minutes. The obtained results are shown in Table B-2. It became extremely difficult to realize a high carrier mobility exceeding 8000 cm2/V·sec of the present invention (second aspect) when a thickness of the graphite sheet is decreased to less than 20 nm. The reason for this is not clear; however, it was concluded that the thickness of the graphite sheet is preferably 20 nm or more for realizing high carrier mobility of the present invention (second aspect).

Examples B-12 to B-17

Several test pieces having different thicknesses were carbonized and graphitized in the same manner as in Examples B-1 except for using the polymer test piece B and the polymer test piece C. A thickness (μm), a thermal conductivity (W/mK), a carrier mobility (cm2/V·sec) and a current density resistance evaluation of each of the resulting graphite sheets are shown in Table B-1. In the sheets having thicknesses shown in this Table, both of the test piece B and the test piece C achieved an excellent characteristic of a carrier mobility of 8000 cm2/V·sec or more by a heat treatment at 3000° C. for 30 minutes.

Examples B-18 to B-21

The test piece (polymer test piece A, thickness 1.2 μm, maximum treatment temperature 3000° C., area 10×10 mm2) used in Example B-3 was cut into smaller-sized square test pieces, that is, measurement area 5×5 mm2 (Example B-18), 2×2 mm2 (Example B-19), 1×1 mm2 (Example B-20) and 0.5×0.5 mm2 (Example B-21), and the thermal conductivity and the carrier mobility of each test piece was measured. Measurement results (Examples B-18 to B-21) are shown in Table B-1. It was found from the results of Table B-1 that the value of the carrier mobility hardly varies even when the test piece area becomes large or becomes smaller. This is a result indicating that the graphite sheet of the present invention (second aspect) has extremely uniform characteristics.

Comparative Examples B-15 to B-18

The test piece (polymer test piece A, thickness 12 μm, maximum treatment temperature 3200° C., area 10×10 mm2) used in Example B-6 was cut into smaller-sized square test pieces, that is, measurement area 5×5 mm2 (Comparative Example B-15), 2×2 mm2 (Comparative Example B-16), 1×1 mm2 (Comparative Example B-17) and 0.5×0.5 mm2 (Comparative Example B-18), and the thermal conductivity and the carrier mobility of each test piece was measured. Measurement results (Comparative Examples B-15 to B-18) are shown in Table B-2. From the results of Table B-2, it was found that the smaller the test piece measurement area becomes, the larger the carrier mobility of the test piece tends to become, and the carrier mobility is reduced to 7100 cm2/V·sec when the area is 1×1 mm2, and increased to 8000 cm2/V·sec when the area is 0.5×0.5 mm2. As described above, it was found that although in measurement of the small area, the characteristic of a carrier mobility exceeding 8000 cm2/V·sec in a range of the present invention (second aspect) can be realized, the characteristic of carrier mobility of the resulting test piece is not uniform, and in measurement of the areas more than 3×3 mm2 in a range of the present invention (second aspect), the characteristic exceeding 8000 cm2/V·sec cannot be realized.

TABLE B-1

| | Polymer Test Piece | Maximum Treatment Temperature (° C.) | Thickness of Graphite Sheet (μm) | Density (g/cm³) | Thermal Conductivity (W/mK) | Carrier Mobility (cm²/V·sec) | Evaluation of Current Desnigy Resistance |
|---|---|---|---|---|---|---|---|
| Example B-1 | A | 3000 | 4.7 | 2.07 | 2040 | 8200 ※1 | ○ |
| Example B-2 | A | 3000 | 2.1 | 2.11 | 2060 | 9400 ※1 | ○ |
| Example B-3 | A | 3000 | 1.2 | 2.22 | 2100 | 9800 ※1 | ○ |
| Example B-4 | A | 3000 | 0.72 | 2.23 | 2080 | 10200 ※1 | ○ |
| Example B-5 | A | 3000 | 0.31 | 2.20 | 2120 | 9800 ※1 | ○ |
| Example B-6 | A | 3000 | 0.14 | — | 2120 | 9300 ※1 | ○ |
| Example B-7 | A | 3000 | 0.06 | — | 1990 | 9100 ※1 | ○ |
| Example B-8 | A | 3000 | 0.04 | — | 1920 | 8060 ※1 | ○ |
| Comparative Example B-19 | A | 3000 | 9.6 | 2.05 | 1960 | 7200 ※1 | x |
| Example B-9 | A | 3100 | 9.5 | 2.13 | 2010 | 9300 ※1 | ○ |
| Example B-10 | A | 3200 | 9.4 | 2.21 | 2110 | 10200 ※1 | ○ |
| Comparative Example B-20 | A | 3000 | 0.02 | — | 1890 | 6520 ※1 | x |
| Comparative Example B-21 | A | 3100 | 0.02 | — | 1930 | 7380 ※1 | x |
| Example B-11 | A | 3200 | 0.02 | — | 2020 | 8150 ※1 | ○ |
| Example B-12 | B | 3000 | 4.3 | 2.15 | 2020 | 8700 ※1 | ○ |
| Example B-13 | B | 3000 | 2.6 | 2.20 | 2100 | 10200 ※1 | ○ |
| Example B-14 | B | 3000 | 0.6 | 2.20 | 1980 | 9000 ※1 | ○ |
| Example B-15 | C | 3000 | 3.4 | 2.20 | 2040 | 9800 ※1 | ○ |
| Example B-16 | C | 3000 | 2.1 | 2.10 | 2000 | 10500 ※1 | ○ |
| Example B-17 | C | 3000 | 0.5 | 2.18 | 1980 | 9000 ※1 | ○ |
| Example B-18 | A | 3000 | 1.2 | 2.22 | 2100 | 9800 ※2 | — |
| Example B-19 | A | 3000 | 1.2 | 2.22 | 2100 | 9800 ※3 | — |
| Example B-20 | A | 3000 | 1.2 | 2.22 | 2100 | 9800 ※4 | — |
| Example B-21 | A | 3000 | 1.2 | 2.22 | 2100 | 9800 ※5 | — |

※1: measuring area 10 × 10 mm²,
※2: measuring area 5 × 5 mm²,
※3: measuring area 2 × 2 mm²,
※4: measuring area 1 × 1 mm²,
※5: measuring area 0.5 × 0.5 mm²

TABLE B-2

| | Test Piece | Maximum Treatment Temperature (° C.) | Thickness of Graphite Sheet (μm) | Treatment Time (minutes) | Thermal Conductivity (W/mK) | Carrier Mobility (cm²/V·sec) | Evaluation of Current Desnigy Resistance |
|---|---|---|---|---|---|---|---|
| Comparative Example B-1 | A | 2800 | 1.3 | 30 | 1760 | 6100 ※1 | x |
| Comparative Example B-2 | A | 2800 | 1.2 | 120 | 1800 | 6400 ※1 | x |
| Comparative Example B-3 | A | 2900 | 1.2 | 30 | 1850 | 7200 ※1 | x |
| Comparative Example B-4 | A | 2900 | 1.2 | 120 | 1880 | 7400 ※1 | x |
| Comparative Example B-5 | A | 3100 | 12 | 30 | 1700 | 6400 ※1 | x |
| Comparative Example B-6 | A | 3200 | 12 | 30 | 1800 | 7540 ※1 | x |
| Comparative Example B-7 | A | 3200 | 11 | 120 | 1850 | 7750 ※1 | x |
| Comparative Example B-8 | A | 3100 | 28 | 30 | 1600 | 5480 ※1 | x |
| Comparative Example B-9 | A | 3200 | 28 | 30 | 1700 | 6500 ※1 | x |
| Comparative Example B-10 | A | 3200 | 26 | 120 | 1750 | 7350 ※1 | x |
| Comparative Example B-11 | A | 3000 | 0.017 | 30 | — | 5030 ※1 | x |
| Comparative Example B-12 | A | 3100 | 0.015 | 30 | — | 6260 ※1 | x |
| Comparative Example B-13 | A | 3200 | 0.012 | 30 | — | 6560 ※1 | x |
| Comparative Example B-14 | A | 3000 | 0.011 | 120 | — | 6730 ※1 | x |
| Comparative Example B-15 | A | 3200 | 12 | 30 | 1800 | 6400 ※2 | — |

TABLE B-2-continued

| | Test Piece | Maximum Treatment Temperature (° C.) | Thickness of Graphite Sheet (μm) | Treatment Time (minutes) | Thermal Conductivity (W/mK) | Carrier Mobility (cm²/V · sec) | Evaluation of Current Densigy Resistance |
|---|---|---|---|---|---|---|---|
| Comparative Example B-16 | A | 3200 | 12 | 30 | 1800 | 6450 ※3 | — |
| Comparative Example B-17 | A | 3200 | 12 | 30 | 1800 | 7100 ※4 | — |
| Comparative Example B-18 | A | 3200 | 12 | 30 | 1800 | 8000 ※5 | — |

※1: measuring area 10 × 10 mm²,
※2: measuring area 5 × 5 mm²,
※3: measuring area 2 × 2 mm²,
※4: measuring area 1 × 1 mm²,
※5: measuring area 0.5 × 0.5 mm²

Comparative Examples B-22 to B-24

Test pieces of Comparative Examples B-22 to B-24 were prepared in the same manner as in Example B-4 using polymer raw materials to which a filler made of calcium phosphate was added by 10% by mass (Comparative Example B-22), 1% by mass (Comparative Example B-23), or 0.1% by mass (Comparative Example B-24), and a polymer raw material not substantially containing a filler (Example B-4), and the characteristics of current density resistance thereof were compared with one another. Measurement samples with a width of 1 mm were cut out of each of the test pieces (Example B-4, Comparative Examples B-22 to B-24), and 10 samples arbitrarily selected were tested. In the samples of Example B-4, the characteristic of current density resistance did not vary from sample to sample in such measurement. However, in the test piece having a filler added by 10% by mass, three of ten samples were broken below the characteristic of current density resistance of copper. Further, in the test piece having a filler added by 1% by mass, one of ten samples was broken. In the test piece having a filler added by 0.1% by mass and the test piece not virtually containing a filler, there was no sample that was broken. From this, it was found that a concentration of a filler in the polymer raw material needs to be 0.1% by mass or less, and the polymer raw material preferably does not substantially contain impurities such as a filler.

Comparative Example B-25

A test piece (Comparative Example B-25) was prepared in the same manner as in Example B-4 except for employing a treatment at 3200° C. in ordinary pressure (without pressurizing) in an argon atmosphere, and the test piece was compared with the test piece of Example B-4 which was treated under pressure (0.1 MPa (1.0 kg/cm2)). The test was performed by cutting measurement samples with a width of 1 mm out of each of the test pieces (Example B-4 and Comparative Example B-25), and measuring the characteristic of current density resistance of 10 samples arbitrarily selected from the measurement samples. In the samples of Example B-4, the characteristic of current density resistance did not vary from sample to sample in such measurement. However, in the samples of Comparative Example B-25, one sample was broken at 50% of an applied current of the test piece of Example B-4. The reason for this is probably that in the test piece of Comparative Example B-25, a thin portion was partially formed during a treatment at 3200° C. That is, this indicates that a means effective for preparation of a graphite film having a uniform thickness is to perform a heat treatment at a temperature of 3000° C. or higher under pressure. It is thought that such a phenomenon becomes more remarkable in the case of graphite having an extremely small thickness of 20 nm or less, and that such a phenomenon indicates a lower limit of the thickness of the graphite sheet of the present invention (second aspect).

Examples B-22 to B-24

The graphite film (thickness 0.06 μm, carrier mobility 9100 cm2/V·sec) prepared in Example B-7 was processed in the form of a line with a line width of 1 mm (Example B-22, a cross-section area in a direction perpendicular to the a-b plane 0.06×10−3 mm2), 0.2 mm (Example B-23, a cross-section area in a direction perpendicular to the a-b plane 0.012×10−3 mm2) or 0.1 mm (Example B-24, a cross-section area in a direction perpendicular to the a-b plane 0.006×10−3 mm2), and the characteristics of current density resistance of these line-like films were measured. The current density resistance varied a little among the line widths; however, all current density resistance was in a range of 2×106 to 2×107 A/cm2. From this, it was found that the characteristic of current density resistance does not vary even when a line width of a graphite wiring material varies.

Comparative Examples B-26 to B-28

Similarly, a copper foil having a thickness of 0.06 μm was processed in the form of a line with a line width of 1 mm (Comparative Example B-26), 0.2 mm (Comparative Example B-27) or 0.1 mm (Comparative Example B-28), and the characteristics of current density resistance of these line-like foils were measured. The current density resistance was about 2×106 A/cm2 in the line width of 1 mm, about 1×106 A/cm2 in the line width of 0.1 mm, and 4×105 A/cm2 in the line width of 0.02 mm, and therefore it was found that in a copper line, the characteristic of current density resistance is deteriorated as the line width (copper line cross section area) is reduced. This indicates that the graphite wiring material is superior in the characteristic of current density resistance to the copper in a fine wiring circuit.

Example B-25

(Production of Wiring Board)
A wiring board was prepared using the graphite sheet prepared in Example B-3 (polymer raw material A, thickness 1.2 μm, carrier mobility 9800 cm2/V·sec).

A polyimide (thickness 12 μm) manufactured by KANEKA CORPORATION as an insulating substrate and Pyralux (registered trademark) LF0100 (modified acrylic adhesive sheet; thickness 25 μm) manufactured by DuPont Co. as an adhesive were stuck together to form an organic polymer film. At first, the graphite sheet and the organic polymer film were bonded to each other at 150° C. with use of a heat laminator to prepare a laminated board for wiring.

Next, processing was performed by using a YVO4 laser marker (MD-V9900 manufactured by KEYENCE CORPORATION) corresponding to Class 4 in IEC Standard (IEC60825-1). A graphite layer was processed into wiring with a line width of 0.4 mm with use of this laser. Thereby, it was found that only the graphite layer can be etched away with little damage to polyimide of the substrate to prepare a graphite wiring material and a graphite wiring board. Finally, the surface of the graphite wiring material etched by the above method was covered with a protective film. The protective film used is a PET (thickness 12 μm)/thermoplastic polyester film resin layer (25 μm) (SC 501 manufactured by Shinchang Hotmelt CO., LTD.).

The wiring board thus prepared has excellent flexibility, and therefore it was found that a wiring board can be prepared using the graphite sheet of the present invention (second aspect) by such a method. Further, it was found that the graphite wiring material used has extremely excellent characteristics as an alternative wiring material to copper.

From descriptions described above, it is found that it is important to set a thickness of a graphite sheet to less than 9.6 μm and 20 nm or more, a temperature of a heating treatment to 3000° C. or higher, and an area of the sheet to 9 mm2 or more, and further to perform a heating treatment under pressure in order to prepare a graphite sheet having a characteristic of high carrier mobility and favorably having a characteristic of current density resistance according to the present invention (second aspect). That is, the present invention (second aspect) was made by finding out that when the conditions as described above are satisfied, it is possible to realize a graphite wiring material having a characteristic of current density resistance exceeding that of a conventional copper wiring material, and exhibiting uniform characteristics in an area of 9 mm2 or more.

The invention claimed is:

1. A graphite sheet (i) having a thickness of 9.6 μm or less and more than 50 nm and a thermal conductivity along the a-b plane direction at 25° C. of 1950 W/mK or more, or (ii) having a thickness in a range of less than 9.6 μand 20 nm or more, an area of 9 mm$^2$ or more, and a carrier mobility along the a-b plane direction at 25° C. of 8000 cm$^2$/V·sec or more.

2. The graphite sheet according to claim 1, having the thermal conductivity of 2080 W/mK or more.

3. The graphite sheet according to claim 1, having an area of 4 mm$^2$ or more.

4. The graphite sheet according to claim 1, having a density of 1.8 g/cm$^3$ or more.

5. The graphite sheet according to claim 1, having an average crystal grain size of 2 μm or more.

6. The graphite sheet according to claim 1, having a characteristic of current density resistance of 2×10$^6$ A/cm$^2$ or more.

7. The graphite sheet according to claim 1, having a thickness of 2.1 μm or less.

8. The graphite sheet according to claim 1, (i) having a thickness of less than 9.6 μm and 20 nm or more, and being obtained by forming an aromatic polymer into a film having a thickness in a range of not more than 25 μm and not less than 30 nm and heat-treating the obtained aromatic polymer film at a temperature of 3000° C. or higher, or (ii) having a thickness of 2.1 μm or less, and being obtained by forming an aromatic polymer into a film having a thickness in a range of not more than 6 μm and not less than 30 nm and heat-treating the obtained aromatic polymer film at a temperature of 3000° C. or higher.

9. The graphite sheet according to claim 8, wherein a heat treatment at 3000° C. or higher is performed in an inert gas, and a gauge pressure of the inert gas is 0.09 MPa or more.

10. The graphite sheet according to claim 8, wherein the aromatic polymer is at least one selected from polyimide, polyamide, polyquinoxaline, polyoxadiazole, polybenzoimidazole, polybenzooxazole, polybenzothiazole, polyquinazolinedione, polybenzoxazinone, polyquinazolone, a benzimidazobenzophenanthroline ladder polymer, and derivatives thereof.

11. A laminated board for wiring, wherein the graphite sheet according to claim 1 is laminated on an insulating organic polymer film or an insulating inorganic substrate.

12. The laminated board for wiring according to claim 11, wherein the graphite sheet is bonded to the insulating organic polymer film or the insulating inorganic substrate with a thermoplastic polymer.

13. A graphite wiring material, being formed by partially removing the graphite sheet according to claim 1.

14. The graphite wiring material according to claim 13, having a width of wiring of 2 mm or less.

15. A method for producing a wiring board, wherein the graphite wiring material according to claim 13 is formed by etching of a laser, and the laser is a carbon dioxide laser, a YAG laser, a YVO$_4$ laser, a fiber laser or an excimer laser.

* * * * *